(12) United States Patent
Tezuka et al.

(10) Patent No.: US 12,040,004 B2
(45) Date of Patent: Jul. 16, 2024

(54) STORAGE DEVICE WITH COUNTER

(71) Applicant: Sony Semiconductor Solutions Corporation, Kanagawa (JP)

(72) Inventors: Hiroyuki Tezuka, Kanagawa (JP); Masami Kuroda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 143 days.

(21) Appl. No.: 17/775,643

(22) PCT Filed: Sep. 29, 2020

(86) PCT No.: PCT/JP2020/036871
§ 371 (c)(1),
(2) Date: May 10, 2022

(87) PCT Pub. No.: WO2021/124638
PCT Pub. Date: Jun. 24, 2021

(65) Prior Publication Data
US 2022/0399049 A1 Dec. 15, 2022

(30) Foreign Application Priority Data
Dec. 16, 2019 (JP) .................................. 2019-226704

(51) Int. Cl.
*G11C 11/00* (2006.01)
*G11C 11/16* (2006.01)

(52) U.S. Cl.
CPC ................................ *G11C 11/1673* (2013.01)

(58) Field of Classification Search
CPC ................................................. G11C 11/1673
(Continued)

(56) References Cited

U.S. PATENT DOCUMENTS 6,990,015 B2    1/2006   Honda et al.
11,087,813 B2   8/2021   Tezuka
(Continued)

FOREIGN PATENT DOCUMENTS

JP          2003257175 A    9/2003
WO   WO2018159246 A1   9/2018
(Continued)

OTHER PUBLICATIONS

International Search Report issued in International Patent Application No. PCT/JP2020/036871 dated Dec. 28, 2020 and English translation of same. 5 pages.

(Continued)

*Primary Examiner* — Hoai V Ho
(74) *Attorney, Agent, or Firm* — K&L Gates LLP

(57) ABSTRACT

A standard potential used for reading is set flexibly according to the state of a storage device. A data memory cell group stores data. A reference memory cell group stores a plurality of reference potentials. A standard potential generating section selects a prescribed number of reference potentials from among the plurality of reference potentials stored in the reference memory cell group and generates the standard potential. A reference potential selection control section controls the selection by the standard potential generating section according to prescribed conditions. A sense amplifier amplifies data read out from the data memory cell group, by using the standard potential as a standard.

7 Claims, 28 Drawing Sheets

(58) Field of Classification Search
USPC .......................................................... 365/158
See application file for complete search history.

(56) References Cited

U.S. PATENT DOCUMENTS

| | | |
|---|---|---|
| 2014/0185361 A1 | 7/2014 | Oh et al. |
| 2019/0279709 A1* | 9/2019 | Lee ..................... G11C 29/028 |
| 2019/0385676 A1 | 12/2019 | Kuroda |
| 2020/0020366 A1 | 1/2020 | Tezuka |

FOREIGN PATENT DOCUMENTS

| | | |
|---|---|---|
| WO | WO2018163731 A1 | 9/2018 |
| WO | WO2018163737 A1 | 9/2018 |

OTHER PUBLICATIONS

Written Opinion issued in International Patent Application No. PCT/JP2020/036871 dated Dec. 28, 2020. 5 pages.

* cited by examiner $vd \simeq i0 * R, \quad R \in RH, RL$ $vr \simeq i0 * \sum Ri\ (i=0\sim(n-1))\ /n, \quad Ri \in RH, RL$

FIG.9

| TEMPERATURE T(°C) | COLUMN NUMBER TO BE SELECTED | RATIO OF REFERENCE CELLS | |
| --- | --- | --- | --- |
| | | RH | RL |
| <25 | 0 | 9 | 7 |
| 25≦T<70 | 1 | 8 | 8 |
| 70≦<T<125 | 2 | 7 | 9 |
| 125≦ | 3 | 6 | 10 |

FIG.11

| VOLTAGE VDD (V) | COLUMN NUMBER TO BE SELECTED | RATIO OF REFERENCE CELLS | |
| --- | --- | --- | --- |
| | | RH | RL |
| <1.0 | 0 | 9 | 7 |
| $1.0 \leqq VDD < 1.1$ | 1 | 8 | 8 |
| $1.1 \leqq < VDD < 1.2$ | 2 | 7 | 9 |
| $1.2 \leqq$ | 3 | 6 | 10 |

FIG.13

| TEMPERATURE T(°C) | COLUMN NUMBER TO BE SELECTED | REGION | RATIO OF REFERENCE CELLS | |
|---|---|---|---|---|
| | | | RH | RL |
| <70 | 0 | A | 8 | 8 |
| | | B | 8 | 8 |
| 70≦ | 1 | A | 7 | 9 |
| | | B | 6 | 10 |

FIG.18

| OPTIONS | COUNTER | RATIO OF REFERENCE CELLS ||
|---|---|---|---|
| | | RL | RH |
| OPTION A | 1 | 4 | 4 |
| OPTION B | 2 | 5 | 3 |
| OPTION C | 3 | 3 | 5 |
| ⋮ | ⋮ | ⋮ | ⋮ | a b c

STORAGE DEVICE WITH COUNTER

TECHNICAL FIELD

The present technology relates to a storage device. To be more specific, the present technology relates to a storage device that reads data from a memory by using a standard potential.

BACKGROUND ART

When reading data stored in a storage device, a standard potential is used to determine whether the data has a low or high potential. This standard potential is usually set to an average potential between the low potential and the high potential. However, the average potential is not always optimal, depending on a state of the storage device, and there are cases where adjustment is necessary depending on the state. Therefore, for example, a semiconductor storage device that performs temperature compensation has been proposed (see, for example, PTL 1).

CITATION LIST

Patent Literature

[PTL1]
JP 2003-257175A

SUMMARY

Technical Problem

In the above-mentioned related technique, temperature compensation is performed by changing a current supplied to a cell array according to a temperature. However, the related technique has a problem that it is difficult to flexibly control the standard potential because the technique needs to control the current source that is the current origin.

The present technique has been created in view of such a situation, and an object is to flexibly set the standard potential used for reading according to the state of the storage device.

Solution to Problem

The present technology has been made to solve the above-mentioned problems, and the first aspect thereof is a storage device including a group of data memory cells for storing data, a group of reference memory cells for storing a plurality of reference potentials, a standard potential generating section for generating a standard potential by selecting a predetermined number of reference potentials from the plurality of reference potentials stored in the reference memory cell group, a reference potential selection control section for controlling selection in the standard potential generating section according to predetermined conditions, and a sense amplifier for amplifying the data read from the data memory cell group with the standard potential set as a standard. This brings about the effect of setting the standard potential in the sense amplifier by the reference potentials selected according to predetermined conditions.

Further, in the first aspect, the reference memory cell group may store one of first and second potentials as the plurality of reference potentials, and the standard potential generating section may select the first and second potentials at a predetermined ratio as the predetermined number of reference potentials to generate a potential between the first potential and the second potential as the standard potential. This brings about the effect of selecting the first and second potentials at a predetermined ratio according to the predetermined conditions to generate the standard potential.

Further, in the first aspect, the standard potential generating section may generate the standard potential by causing short circuit between the first potential and the second potential that are selected at the predetermined ratio on a signal line. This brings about the effect of generating the standard potential by causing short circuit between the first potential and the second potential on a signal line.

Still further, in this first aspect, the reference potential selection control section may include a sensor for measuring a physical quantity of a surrounding environment and may control the selection in the standard potential generating section according to the condition of the physical quantity as the predetermined condition. This brings about the effect of setting the standard potential in the sense amplifier by the reference potentials selected according to the physical quantity condition measured by the sensor.

Furthermore, in this first aspect, the sensor may measure at least one of temperature, voltage, and magnetic force as the physical quantity. This brings about the effect of setting the standard potential in the sense amplifier on the basis of reference potentials selected according to the measured temperature, voltage or magnetic force.

In addition, in this first aspect, the reference potential selection control section may control the selection in the standard potential generating section according to the condition of the physical quantity different for each region in the storage device. This brings about the effect of setting the standard potential in the sense amplifier by using the reference potentials selected according to the physical quantity conditions that differ from region to region.

Further, in this first aspect, a command control section that receives a command giving an instruction to access the data memory cell group is further provided, and the reference potential selection control section may have control to suppress the change of the standard potential when the execution of the command is in progress. This brings about the effect of suppressing the change in the standard potential during the execution of the command.

Further, in this first aspect, the reference potential selection control section may include an error detecting section that detects an error in the data read from the data memory cell group and may control the selection in the standard potential generating section according to the error detection condition as the predetermined condition. This brings about the effect of setting the standard potential in the sense amplifier by using the reference potentials selected according to the error detection conditions.

Still further, in this first aspect, the reference memory cell group may store one of first and second potentials as the plurality of reference potentials, and the standard potential generating section may select the first and second potentials at a predetermined ratio as the predetermined number of reference potentials to generate a potential between the first potential and the second potential as the standard potential, and the reference potential selection control section may sequentially change the ratio of the first and second potentials while the error is detected. This brings about the effect of setting the standard potential in the sense amplifier by using the reference potentials selected according to the error detection conditions without interrupting the reading operation.

In addition, in the first aspect, the reference potential selection control section further includes a counter for switching the combination having a ratio between the first and second potentials, and may perform the switching of the counter to change the ratio between the first and second potentials until no error is detected. This brings about the effect of changing the ratio between the first and second potentials according to the value of the counter to set the standard potential in the sense amplifier.

Furthermore, in the first aspect, as for the reference memory cell group, a resistance-change-type memory cell may be assumed as a storage element.

BRIEF DESCRIPTION OF DRAWINGS

FIG. 9 is a diagram illustrating an example of the relation between the temperature and the ratio of the reference cells according to the first embodiment of the present technology.

FIG. 11 is a diagram illustrating an example of the relation between the voltage and the ratio of the reference cells according to the first embodiment of the present technology.

FIG. 13 is a diagram illustrating an example of the relation between the voltage and the ratio of the reference cells for each region according to the first embodiment of the present technology.

FIG. 18 is a diagram illustrating an example of options for the ratio of the reference cells according to the second embodiment of the present technology.

DESCRIPTION OF EMBODIMENTS

Hereinafter, modes for carrying out the present technology (hereinafter referred to as embodiments) will be described. The description will be given in the following order.

1. First embodiment (example of selecting reference cells according to a measured physical quantity)
2. Second embodiment (example of selecting reference cells according to an error detection state)
3. Application example 1. First Embodiment

[Storage Device]

Figure 1:
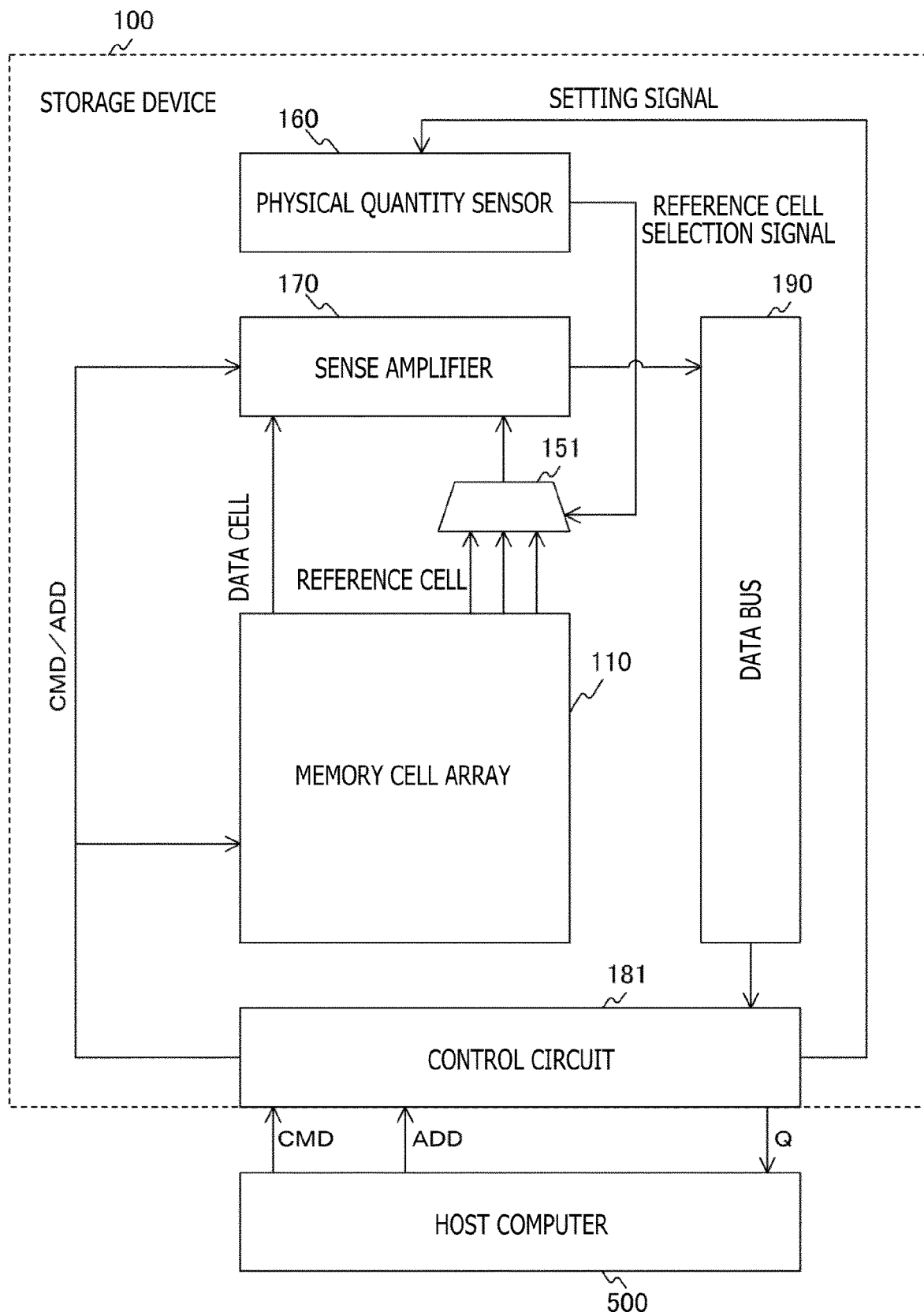
FIG. 1 is a diagram illustrating an overall configuration example of a storage device 100 according to a first embodiment of the present technology.

FIG. 1 is a diagram illustrating an overall configuration example of a storage device 100 according to the first embodiment of the present technology.

The storage device 100 includes a memory cell array 110, a selection circuit 151, a physical quantity sensor 160, a sense amplifier 170, a control circuit 181, and a data bus 190.

The memory cell array 110 is made by arranging memory cells in a two-dimensional matrix state (array state). As the memory cell, for example, a resistance-change-type memory cell that stores one of two values according to the resistance state is assumed. As the resistance-change-type memory cell, for example, MRAM (Magnetoresistive Random Access Memory) using a magnetic tunnel junction (MTJ) element is assumed, but this embodiment can be applied to other storage elements that are premised on a reference cell such as a ferroelectric memory (FeRAM: Ferroelectric Random Access Memory). The memory cell array 110 includes a data memory cell group for storing data and a reference memory cell group for storing reference potentials. Incidentally, the memory cell array 110 is an example of the data memory cell group and the reference memory cell group described in the claims.

The physical quantity sensor 160 is a sensor that measures the physical quantity of the surrounding environment. The output of the physical quantity sensor 160 is used for selection control in the selection circuit 151 according to predetermined conditions. As the physical quantity measured by the physical quantity sensor 160, a temperature, a voltage, a magnetic force (magnetic field strength, and a magnetic flux density) are assumed, for example. Note that the physical quantity sensor 160 is an example of the sensor and the reference potential selection control section described in the claims.

The selection circuit 151 is a circuit that selects a predetermined number of reference potentials from a plurality of reference potentials stored in the reference memory cell group of the memory cell array 110. A standard potential is generated on the basis of a plurality of reference potentials selected by the selection circuit 151. Incidentally, the selection circuit 151 is an example of the standard potential generating section described in the claims.

The sense amplifier 170 is a sense amplifier that amplifies the data read from the data memory cell group of the memory cell array 110 with the generated standard potential as a standard. The data bus 190 is a bus that supplies the output of the sense amplifier 170 to the control circuit 181.

The control circuit 181 performs input/output to and from a host computer 500. The control circuit 181 receives a command (CMD) and an address (ADD) signal from the host computer 500, and controls the memory cell array 110 and the sense amplifier 170 on the basis of these signals. In the case of a read command, data is read from the memory cell array 110, and determined by the sense amplifier 170 to be output to the control circuit 181 via the data bus 190. The control circuit 181 supplies the data output from the data bus 190 to the host computer 500. Further, the control circuit 181 makes various settings such as setting of the sensitivity of the physical quantity and setting of the threshold value for the physical quantity sensor 160. Note that the control circuit 181 is an example of the command control section described in the claims.

[Memory Cell Array]

Figure 2:
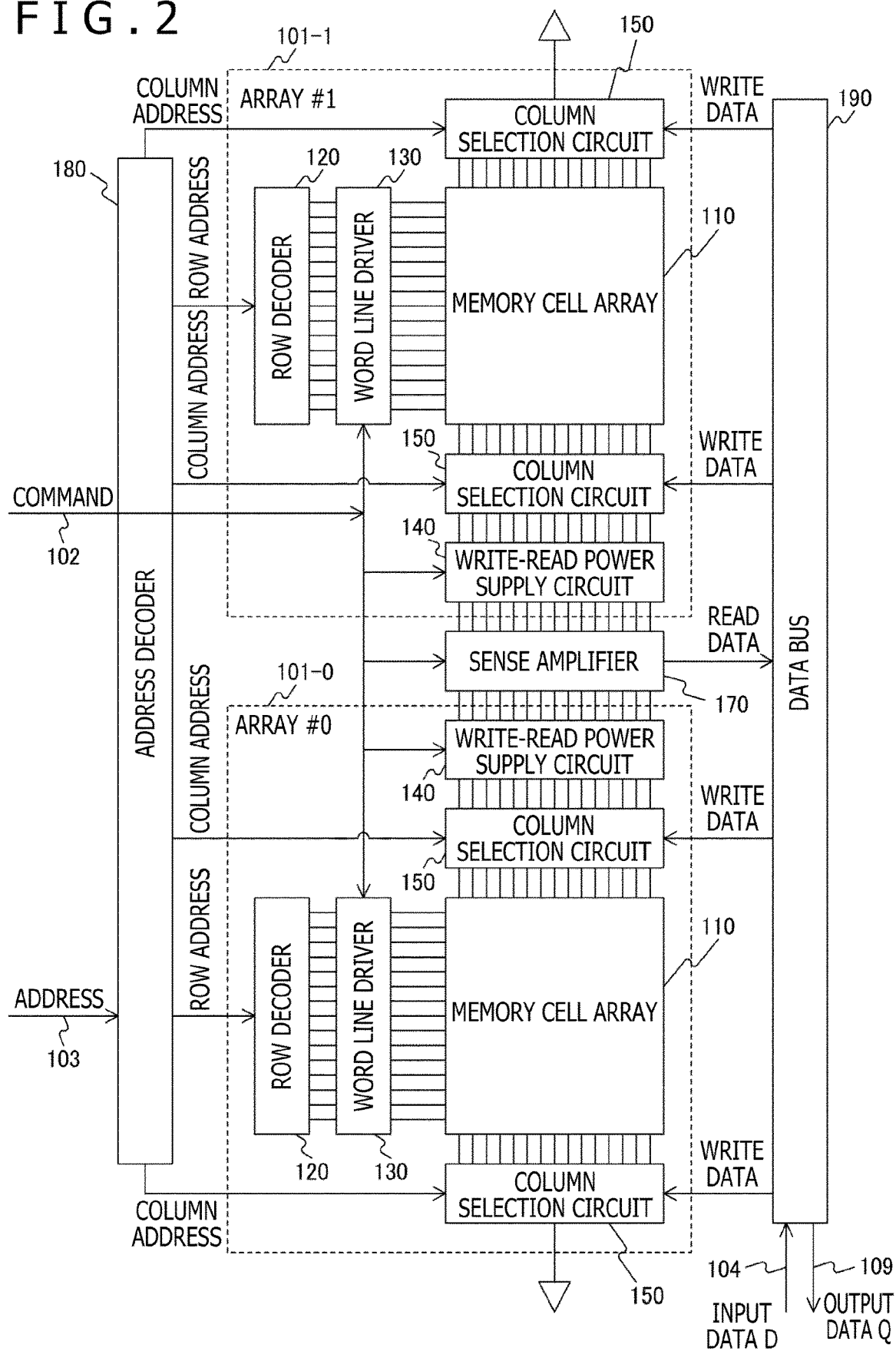
FIG. 2 is a diagram illustrating a configuration example of a memory cell array 110 and its surroundings according to the embodiment of the present technology.

FIG. 2 is a diagram illustrating a configuration example of the memory cell array 110 and its surroundings in the embodiment of the present technology.

The storage device 100 includes two arrays #0 (101-0) and #1 (101-1), the sense amplifier 170, an address decoder 180, and the data bus 190, for example. Each of the arrays 101-0 and 101-1 includes the memory cell array 110.

The address decoder 180 decodes the address indicated through a signal line 103 from the host computer 500 to generate the row address and the column address in the memory cell array 110.

The sense amplifier 170 is a sense amplifier that amplifies the values read from each of the arrays 101-0 and 101-1 for outputting. The sense amplifier 170 is provided corresponding to one column or a plurality of examples of the memory cell array 110. Each of the sense amplifiers 170 has two input terminals, to one of which the potential of the sensing target is input, and to the other of which the standard potential is input. As a result, the sense amplifier 170 amplifies the potential to be sensed with the standard potential as a standard and outputs read data. That is, the sense amplifier 170 outputs data according to the magnitude relation of the potentials supplied to the two input terminals.

The data bus 190 is a bus for inputting/outputting data to/from the host computer 500. That is, the data bus 190 outputs the read data from the sense amplifier 170 to the host computer 500 via an output data Q terminal 109. Further, the data bus 190 receives write data from the host computer 500 via an input data D terminal 104 and supplies the write data to the arrays 101-0 and 101-1.

Each of the arrays 101-0 and 101-1 includes a row decoder 120, a word line driver 130, a write-read power supply circuit 140, and a column selection circuit 150, in addition to the memory cell array 110. The row decoder 120 decodes the row address supplied from the address decoder 180. The word line driver 130 is a driver that drives the word line decoded by the row decoder 120. The write-read power supply circuit 140 is a circuit that supplies power required for writing or reading. The column selection circuit 150 selects the columns of the memory cell array 110 according to the column addresses supplied from the address decoder 180.

A command is supplied from the processor to each of the arrays 101-0 and 101-1 by a signal line 102. Each of the arrays 101-0 and 101-1 performs the necessary operations such as read and write according to this command.

Figure 3:
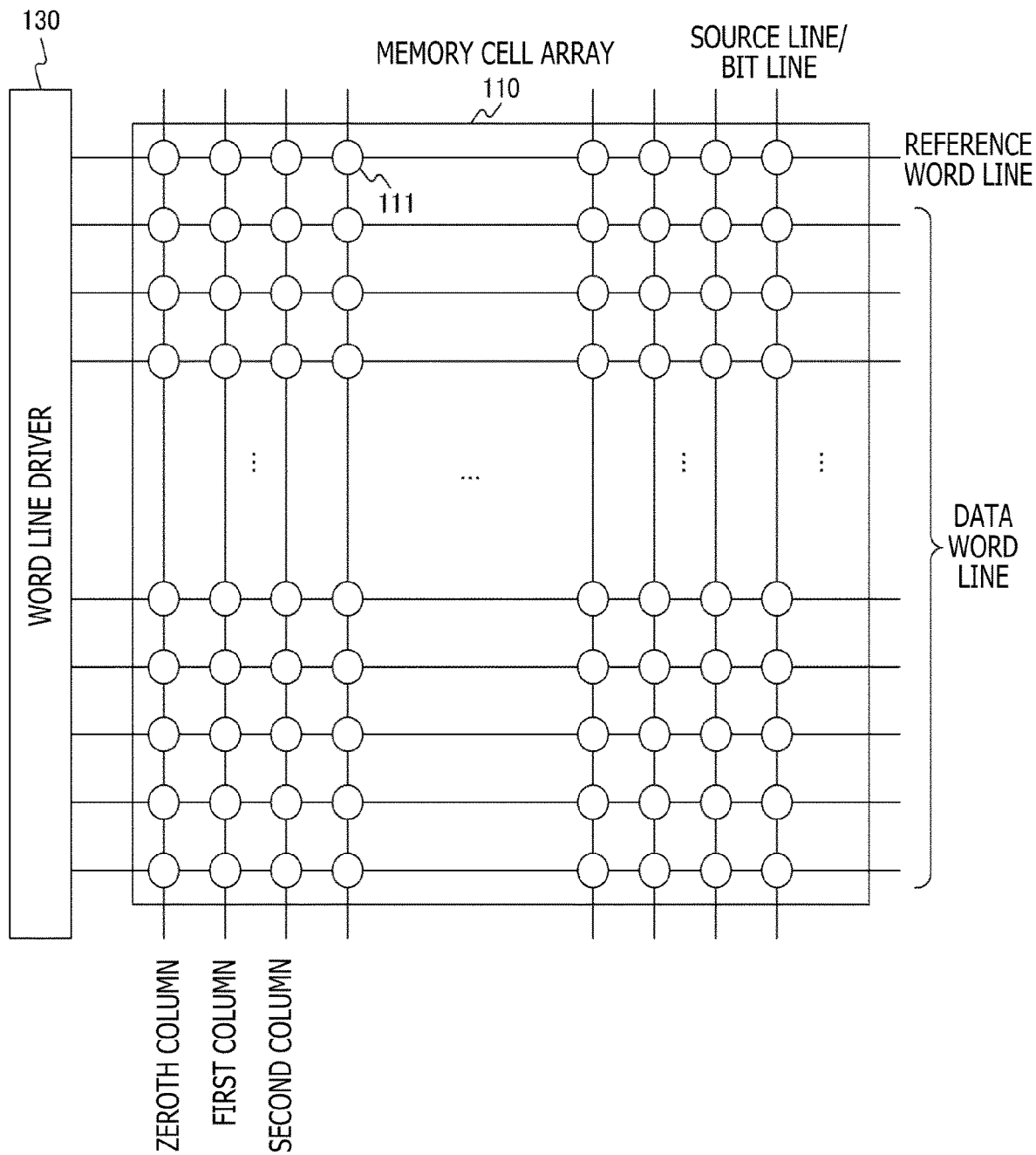
FIG. 3 is a diagram illustrating a configuration example of the memory cell array 110 according to the embodiment of the present technology.

FIG. 3 is a diagram illustrating a configuration example of the memory cell array 110 according to the embodiment of the present technology.

The memory cell array 110 is configured by arranging memory cells 111 in a two-dimensional matrix. The memory cells 111 in the memory cell array 110 are driven by the word line driver 130 in units of word lines in the row direction. Further, source lines and bit lines are formed in the column direction, and connected to the memory cells 111 in series, respectively.

The word line of the memory cell array 110 includes a data word line used as a storage area of normal data and a reference word line used as a reference cell. The reference cell is used to generate a standard potential at the time of reading data, as described above.

In the case of the open type configuration, the reference cells are arranged in the word line direction. That is, in order to access the reference cell, it is necessary to activate the specific word line of the reference cell (reference word line: RWL). Note that although an open type configuration is assumed here, the configuration does not necessarily have to be an open type.

In this example, the reference word line is depicted in the top-level row of the memory cell array 110, but the line may be arranged in any row. For example, arranging the reference word line in the center row of the memory cell array 110 is desirable from the viewpoint of parasitic resistance.

Figure 4:
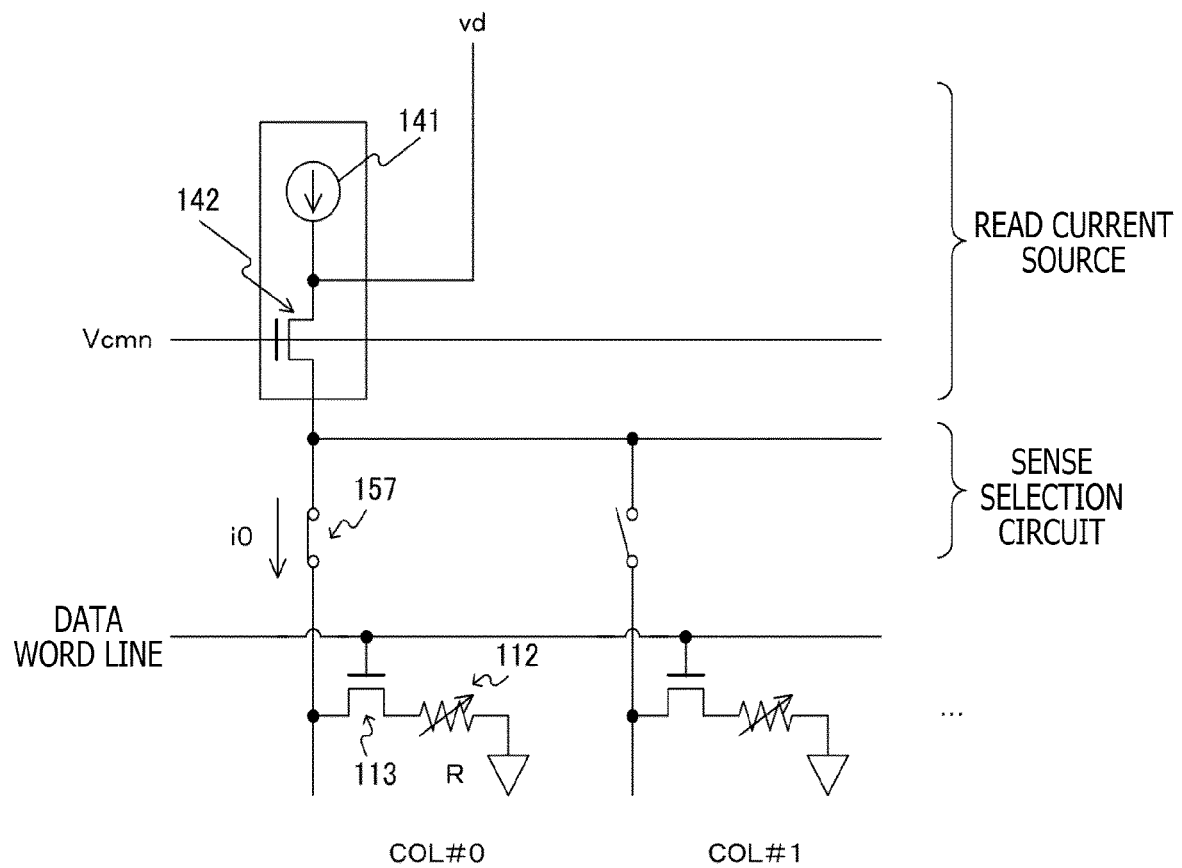
FIG. 4 is a diagram illustrating an example of a state when reading is carried out in a memory cell 111 according to the embodiment of the present technology as a data cell.

FIG. 4 is a diagram illustrating an example of a state when reading is carried out in the memory cell 111 according to the embodiment of the present technology as a data cell.

The memory cell 111 is formed by connecting a resistance-change-type element 112 and a switch 113 in series between a source line and a bit line. The resistance-change-type element 112 allocates a logical value according to the resistance value, such as "1" when the resistance value R is in a high resistance state (RH) and "0" when the resistance value R is in a low resistance state (RL). When determining this logic value by using the sense amplifier 170 with two inputs, it is necessary to convert the resistance value into an input potential, so that a current injection type amplifier is used. In this example, a current source 141 and a switch 142 are used as a read current source.

The current source 141 is a current source for passing a current through the resistance of the memory cell 111. The switch 142 controls the operation of a read current source, and when a voltage Vcmn is applied to the gate electrode, the switch 142 becomes conductive and causes a current to flow toward the resistance of the memory cell 111.

A sense selection circuit 157 is connected between the read current source and the memory cell 111. Due to this, current is supplied only to the memory cell 111 selected by the sense selection circuit 157, and reading is performed.

In this case, assuming that the current value supplied from the current source 141 is i0 and the resistance value of the resistance-change-type element 112 is R (R indicates RH or RL), the potential vd at the observation end gradually becomes equal to "i0×R." Therefore, the resistance value R of the resistance-change-type element 112 can be known by measuring the potential input to the sense amplifier 170.

Figure 5:
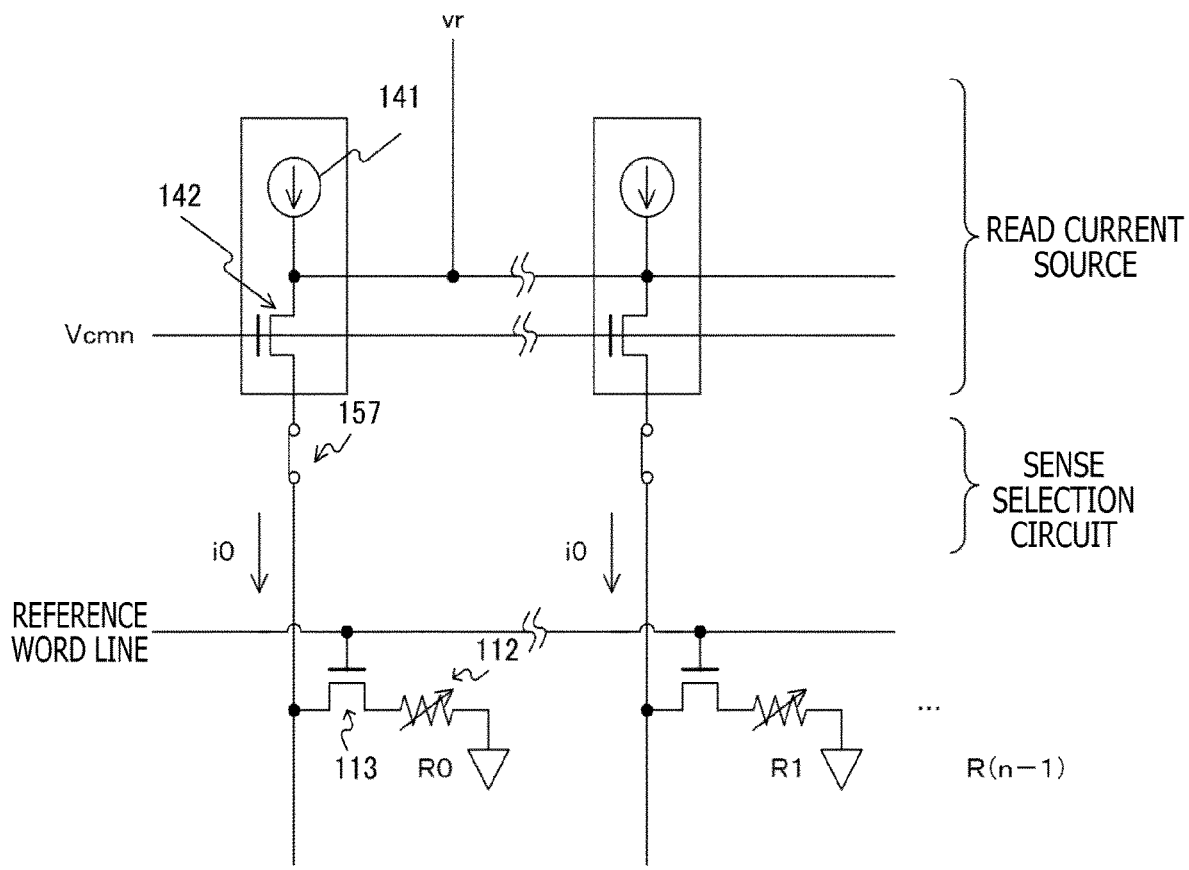
FIG. 5 is a diagram illustrating an example of a state when reading is carried out in the memory cell 111 according to the embodiment of the present technology as a reference cell.

FIG. 5 is a diagram illustrating an example of a state when reading is carried out in the memory cell 111 of the embodiment of the present technology as a reference cell.

Although several generation methods can be considered for generating the standard potential for determining the logical value, it is appropriate to use the memory cell for the generation of the standard potential as well. This is from the viewpoint of robustness of sensing operation. For example, in the case where the resistance value of the memory cell of the sensing target is biased due to some parameter variation during the memory cell production process, the standard potential is similarly biased accordingly, so that the influence is canceled.

Therefore, in this example, the output potentials from a plurality of memory cells (reference cells) are short-circuited to generate an intermediate potential. Due to this, the standard potential becomes a value between the potential of RL and the potential of RH. Accordingly, a plurality of sense selection circuits 157 is made conductive. In this case, assuming that the current value supplied from the current source 141 is i0 and the resistance value of the resistance-change-type element 112 is Ri (i=0 to (n−1)), the potential vr at the observation end gradually becomes equal to "i0× ΣRi/n." Note that the number of connections n is 1 or more, and as the number becomes larger, the operation becomes more robust against the resistance value variation of the reference cell.

By connecting the two observation ends generated in such a way to the two inputs of the sense amplifier 170, the logical state of the sensing target can be observed.

[Ratio of Reference Cells]

Figure 6:
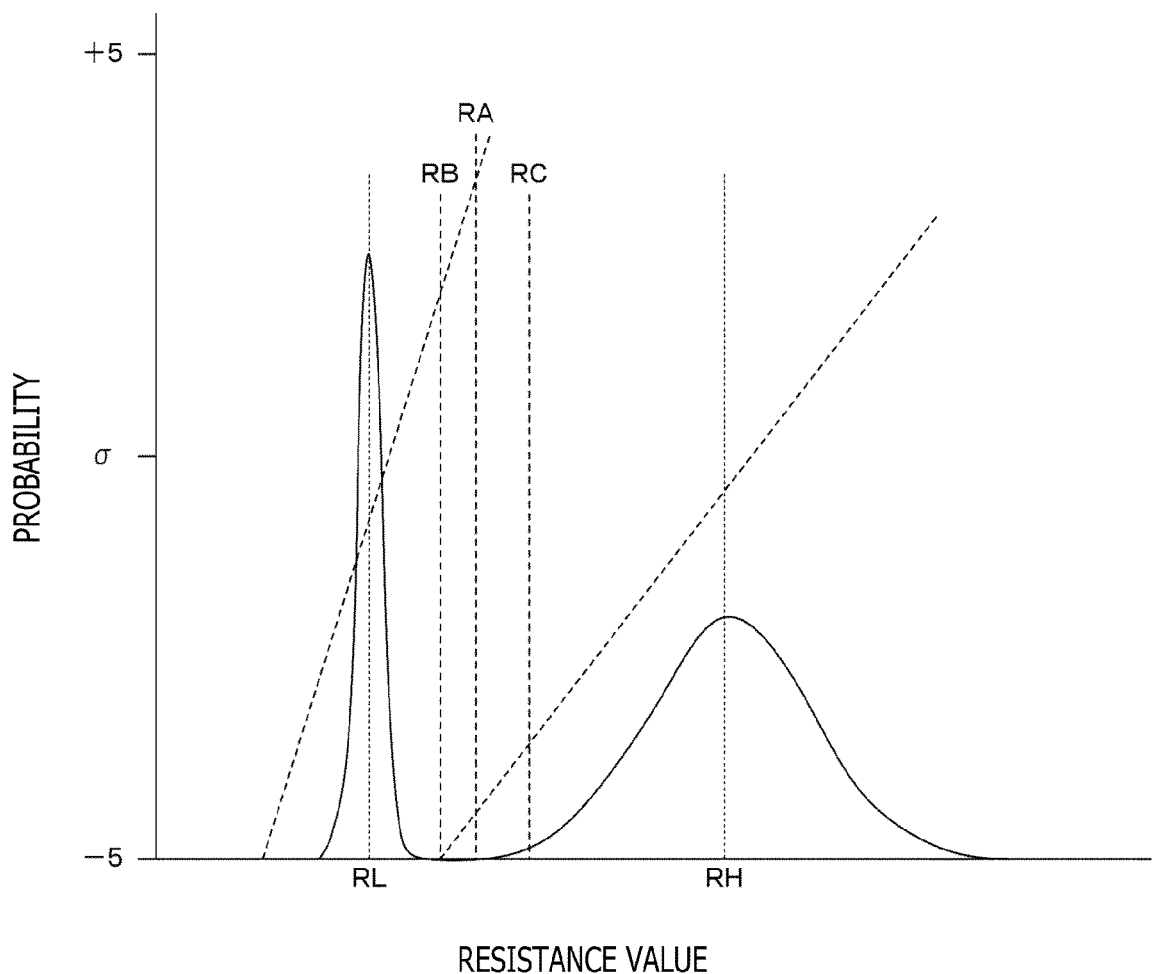
FIG. 6 is a diagram illustrating an example of the resistance distribution of a resistance-change-type element 112 according to the embodiment of the present technology.

FIG. 6 is a diagram illustrating an example of the resistance distribution of the resistance-change-type element 112 in the embodiment of the present technology.

For example, in the case of an MTJ element, the distribution in the low resistance state (RL) is concentrated in a narrow range of resistance values, and on the other hand, the distribution in the high resistance state (RH) exhibits a relatively wide range of resistance values. Therefore, the ratio 1:1 is not always optimum regarding the ratio of the high resistance state (RH) to the low resistance state (RL) at the time of generating the standard potential, and the optimum ratio differs depending on the operating point of the sense amplifier 170.

Therefore, in the present embodiment, it is assumed that a potential obtained by causing short circuit between a voltage due to the resistance in the high resistance state (RH) and a voltage due to the resistance in the low resistance state (RL) at any ratio is used as a standard potential in the sense amplifier 170, as described below.

Figure 7:
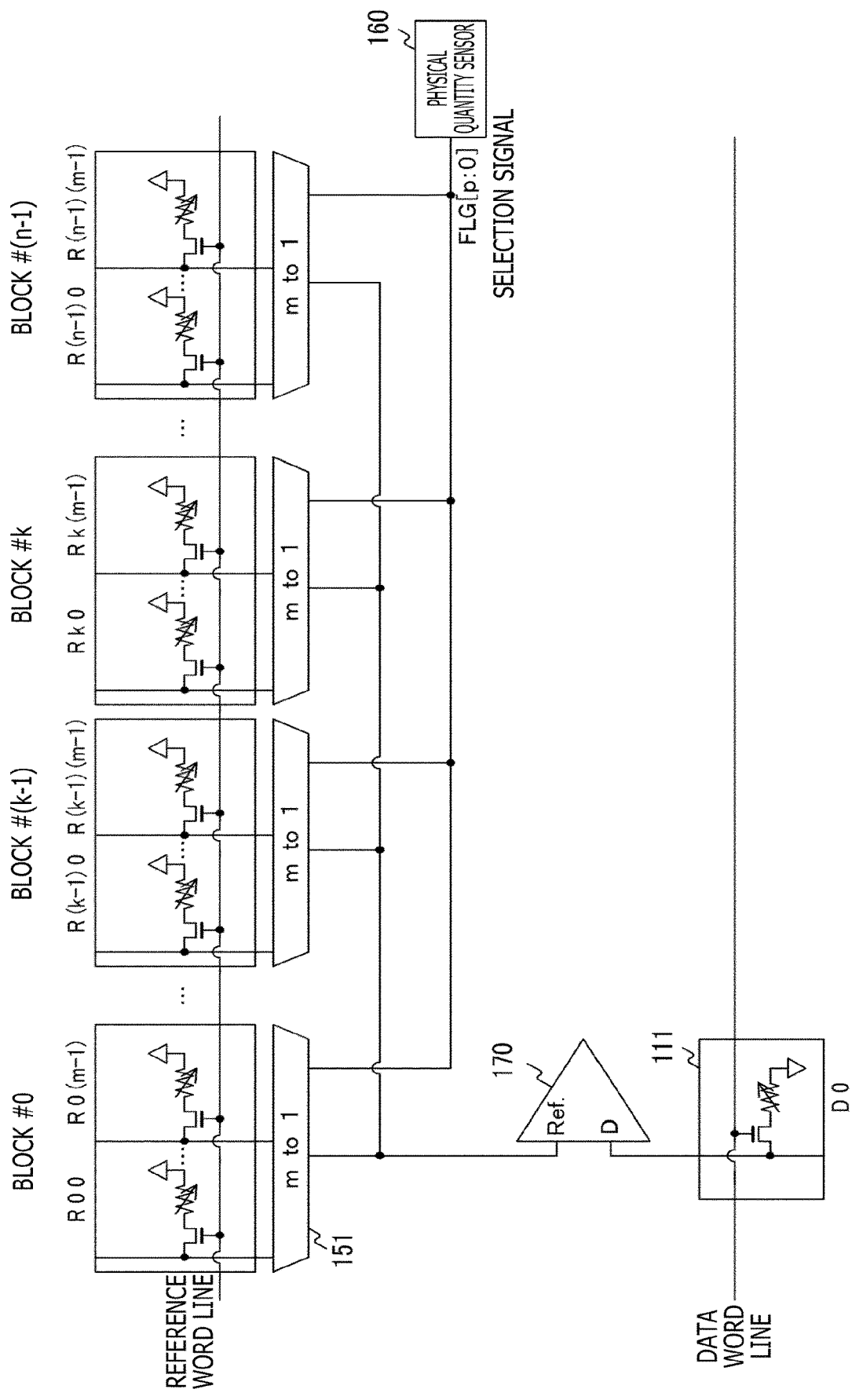
FIG. 7 is a diagram illustrating a circuit example for generating a standard potential according to the first embodiment of the present technology.

FIG. 7 is a diagram illustrating a circuit example for generating a standard potential in the first embodiment of the present technology.

In this example, for the sake of simplicity, the constant current source and the writing power source are omitted, and a sense amplifier 170 and only one memory cell 111 connected to the sense amplifier 170 is illustrated. Needless to say, as long as the connection relation is maintained, a plurality of sense amplifiers 170 and a selection circuit that is connected to the sense amplifier 170 and selects one of a plurality of pieces of data may be included.

This circuit includes n blocks each made by bundling together m reference cells each generating a reference potential. Then, the selection circuit 151 is configured to select one from m cells for each block and short-circuit the cells of n blocks to generate a standard potential. For example, in the case of n=2t (t is a natural number), when the k=t blocks of the n blocks is in the high resistance state (RH), and the remaining n−k=t blocks are in the low resistance state (RL), the reference potential to be made is approximately half of the potential corresponding to RH/RL. Here, a case where the resistance state of the cell corresponding to each column number is different for each block is considered. Then, the selection signal FLG [p:0] indicating which column number is to be selected in the selection circuit 151 is output from the physical quantity sensor 160.

[Temperature]

Figure 8:
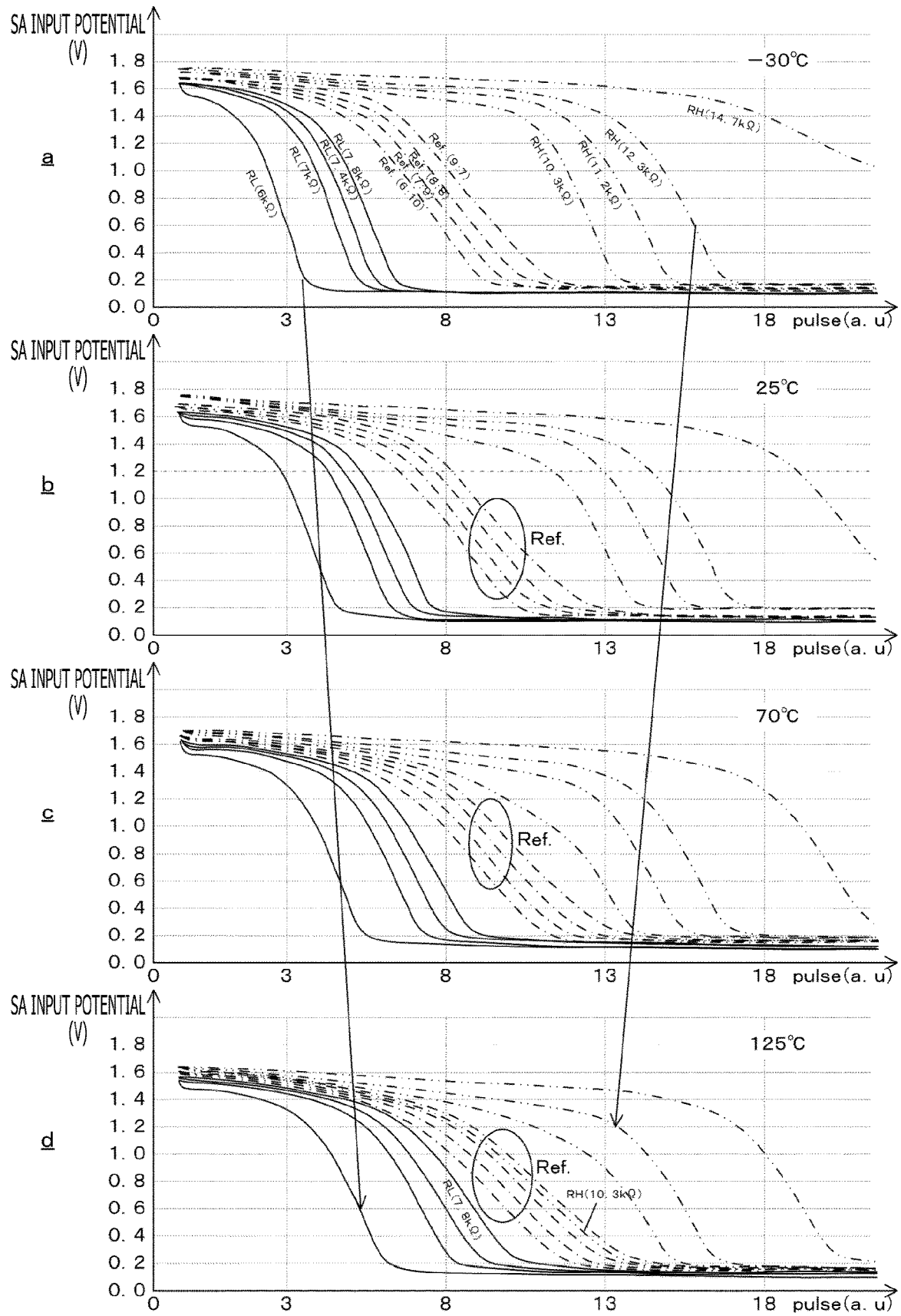
FIG. 8 illustrates diagrams of a simulation result of a relation between the temperature and the resistance distribution of the resistance-change-type element 112 according to the embodiment of the present technology.

FIG. 8 illustrates diagrams of a simulation result of the relation between the temperature and the resistance distribution of the resistance-change-type element 112 in the embodiment of the present technology.

In this simulation result, the input potential of the sense amplifier 170 generated by the resistance value corresponding to 0 to ±5σ of the resistance value distribution of RH/RL is calculated, and the potentials having different ratios of RH/RL of the reference potential are superimposed on the input potential to be exhibited for each temperature. The graph a in the figure illustrates the case of "−30° C.," b of the figure illustrates the case of "25° C.," c of the figure illustrates the case of "70° C.," and d of the figure illustrates the case of "125° C." In each case, the vertical axis indicates the input potential of the sense amplifier 170, and the horizontal axis indicates the passage of time.

Here, the solid line illustrates the potential in the low resistance state (RL), and the resistance values are "6 KΩ," "7 KΩ," "7.4 KΩ," and "7.8 KΩ" in the order of the potential drop timing from the earliest. Further, the two-dot chain line illustrates the potential in the high resistance state (RH), and the resistance values are "10.3 KΩ," "11.2 KΩ," "12.3 KΩ," and "14.7 KΩ" in the order of the potential drop timing from the earliest. Still further, the dash-dot-dash line indicates the reference potential, and the RH:RL is "6:10," "7:9," "8:8," "9:7" in the order of the potential drop timing from the earliest.

It should be noted that these resistance values are RL/RH values at 25° C. The ratio of RL to RH is called the Tunnel Magneto Resistance (TMR) ratio, and generally decreases as the temperature rises.

TMR=RL/(RL+RH)

TMR=TMR0×(1+Tc)×(temperature (K)−25)

In the figure, as an example, it is assumed that TMR @ 25° C. (TMR0)=145% and Tc=−0.0028 (1/K).

The reference potential is statistically generated by the resistances of 6 KΩ and 14.7 KΩ which are the medians of the resistance distribution of RH and RL. Therefore, a small number of low resistance elements in the memory cell array 110 (for example, RH=10.3 KΩ) may be erroneously determined as L when the ratio of RH:RL is "9:7" in the case of 125° C. In other words, it can be seen that the read margin can be optimized by switching the reference potential to be used depending on the temperature.

FIG. 9 is a diagram illustrating an example of the relation between the temperature and the ratio of the reference cells in the first embodiment of the present technology.

This example is an example in the case where a temperature sensor is used as the physical quantity sensor 160, and m=4, n=16, and p=1 are set. According to this, the selection circuit 151 makes a selection such that the ratio is "9:7" when the temperature T indicated by the physical quantity sensor 160 is lower than 25° C., the ratio is "8:8" when the temperature T is 25° C. or higher and lower than 70° C., the ratio is "7:9" when the temperature T is 70° C. or higher and lower than 125° C., and the ratio is "6:10" when the temperature T is 125° C. or higher. Thereby, the ratio of the reference cells can be determined according to the temperature.

Figure 10:
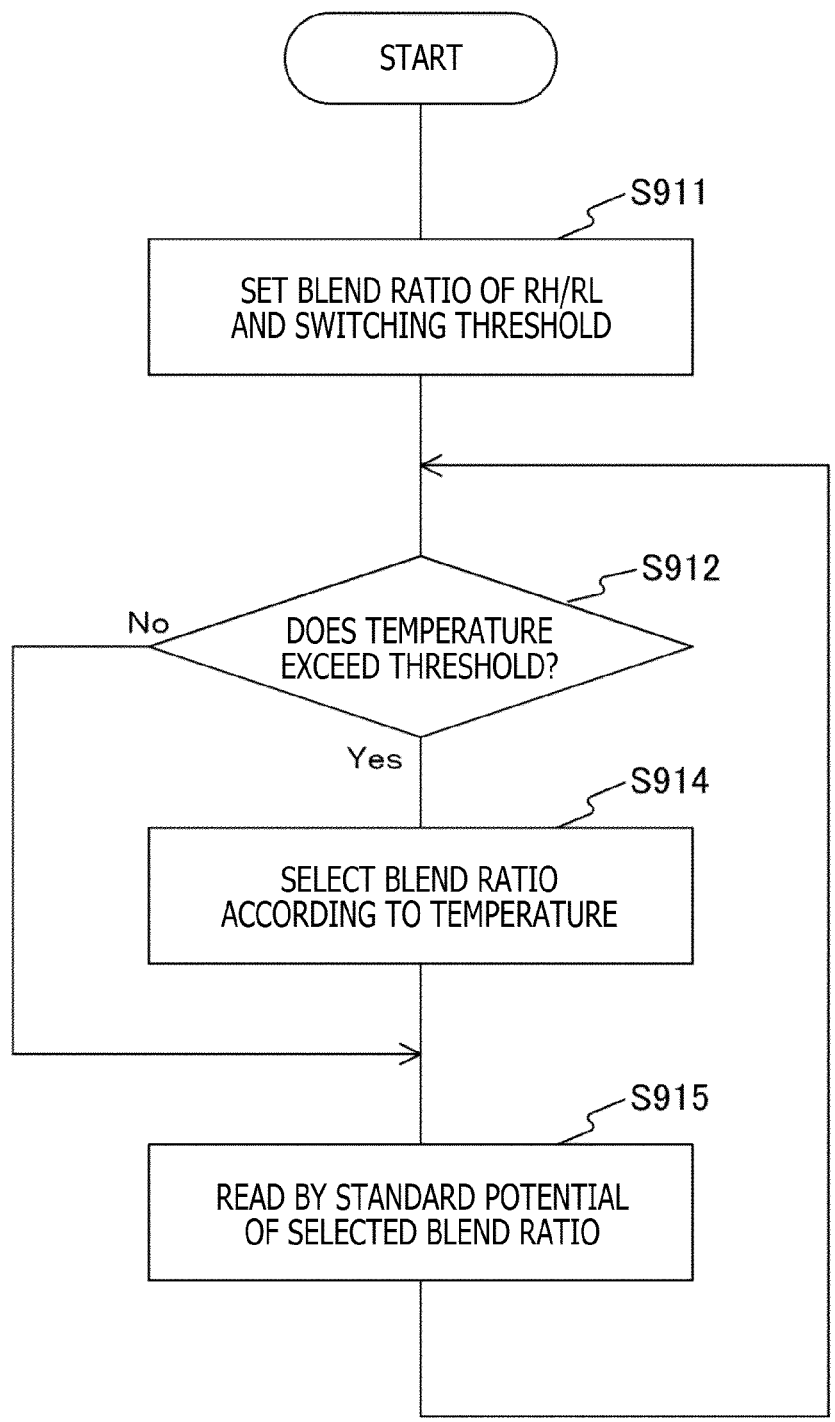
FIG. 10 is a flow chart illustrating an example of a processing procedure in the case of determining the ratio of reference cells according to the temperature in the first embodiment of the present technology.

FIG. 10 is a flow chart illustrating an example of a processing procedure in the case of determining the ratio of reference cells according to the temperature in the first embodiment of the present technology.

The optimum RH/RL blend ratio (ratio of reference cells) for a certain temperature is identified and set in advance in the reference cell (step S911). Further, a threshold value for switching the cell group to be used is set in the physical quantity sensor 160 (step S911).

In the case where the temperature exceeds the threshold value in the physical quantity sensor 160 (step S912: Yes), the blend ratio corresponding to the temperature is selected (step S914). Then, reading is performed using the standard potential of the selected blend ratio (step S915).

It should be noted that although an example in the case of determining the ratio of reference cells according to the temperature has been described here, similar processing can be generalized to all physical quantities.

[Voltage]

In the above example, an example in the case where a temperature sensor is used as the physical quantity sensor 160 has been described, but in the following example, an example in the case where a voltage sensor is used as the physical quantity sensor 160 will be described.

FIG. 11 is a diagram illustrating an example of the relation between the voltage and the ratio of the reference cells in the first embodiment of the present technology.

This example is an example in which a voltage sensor is used as the physical quantity sensor 160, and which satisfies m=4, n=16, and p=1. According to this, the selection is made in the selection circuit 151 such that the ratio is "9:7" when the voltage VDD indicated by the physical quantity sensor 160 is less than 1.0 V (volt), the ratio is "8:8" when the voltage VDD is 1.0 V or more and less than 1.1 V, the ratio is "7:9" when the voltage VDD is 1.1 V or more and less than 1.2 V, and the ratio is "6:10" when the voltage VDD is 1.2 V or more. Thereby, the ratio of the reference cells can be determined according to the voltage.

[For Each Region]

In the above example, an example in which a uniform reference cell ratio is used for the entire memory cell array 110 has been described, but in the following example, an example in which the handling of the reference cell ratio is changed for each region of the memory cell array 110 will be described.

Figure 12:
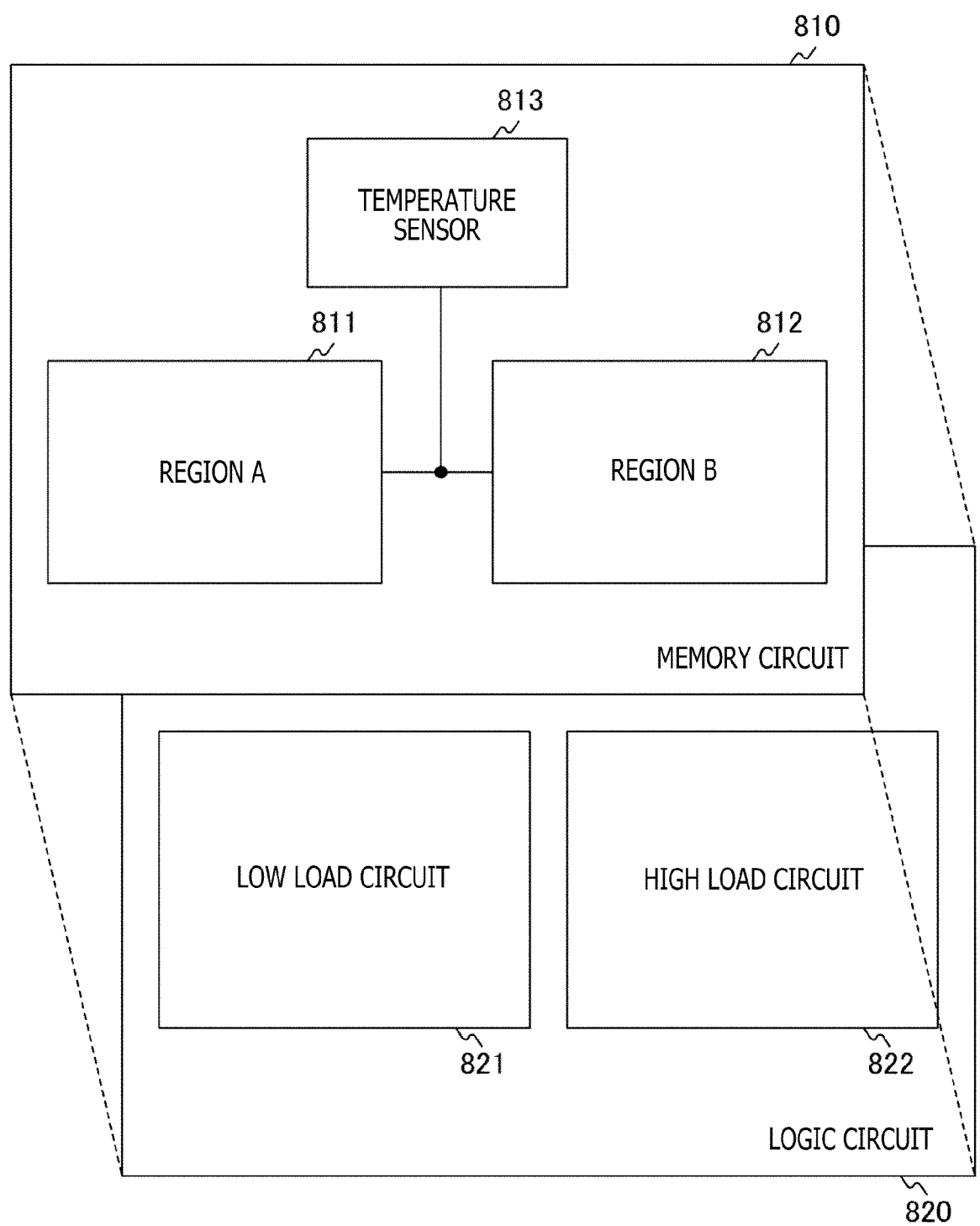
FIG. 12 is a diagram illustrating an example of a case where the storage device 100 according to the first embodiment of the present technology is configured by a laminated substrate.

FIG. 12 is a diagram illustrating an example in the case where the storage device 100 according to the first embodiment of the present technology is configured by a laminated substrate.

In this example, it is assumed that a memory circuit 810 and a logic circuit 820 are formed on different substrates to form a laminated substrate. The memory circuit 810 includes a region A 811 and a region B 812 of the memory cell array 110, and a temperature sensor 813. The logic circuit 820 includes a low load circuit 821 and a high load circuit 822. The region A 811 is stacked in a place close to the low load circuit 821, and the region B 812 is stacked in a place close to the high load circuit 822. That is, a hot spot is generated in the region B 812, which has a temperature higher than that in the region A 811.

In this case, there is a correlation between the temperature at the place where the physical quantity sensor 160 exists and the local temperature of the memory circuit 810. That is, in the case where the temperature indicated by the physical quantity sensor 160 reaches a specific temperature (high temperature T=TH), it can be estimated that the temperature at the region B 812 becomes high temperature T=TH'. Therefore, with this relation in mind, the ratio of RH/RL of the reference cells is changed between the region A 811 and the region B 812. As a result, even if there is only one physical quantity sensor 160 in the memory circuit 810, a plurality of RH/RL ratios different for each region can be set in the memory circuit 810. Needless to say, the number of the regions where the ratio of RH/RL is different is not limited to two, and may be three or more, and the number of the temperature classifications may be three or more, as well.

Further, such a setting for each region is useful when memory cells having different characteristics are mixedly mounted in one memory macro. For example, even in the same MRAM cell, the data retention, the writing speed, or the resistance value can be changed depending on the tuning, so that one memory macro can fulfill a plurality of memory functions. For example, the retention characteristics (data retention) can be improved by increasing the volume of the magnetic material constituting the memory cell. Further, the writing speed can be increased by lowering the thermal stability index A (energy barrier). Still further, by adjusting the diameter of the MTJ so that the diameter increases or decreases, the resistance value changes to low or high, and the energy consumption can be adjusted.

FIG. 13 is a diagram illustrating an example of the relation between the voltage and the ratio of the reference cells for each region in the first embodiment of the present technology.

According to this, when the temperature T indicated by the physical quantity sensor 160 is less than 70° C., the selection is made in the selection circuit 151 so that the ratio becomes "8:8" in the regions A and B. In addition when the temperature T indicated by the physical quantity sensor 160 is 70° C. or higher, the selection is made in the selection circuit 151 so that the ratio becomes "7:9" in the region A and "6:10" in the region B. Thereby, the ratio of the reference cells can be determined according to the voltage for each region.

Modification Example

Figure 14:
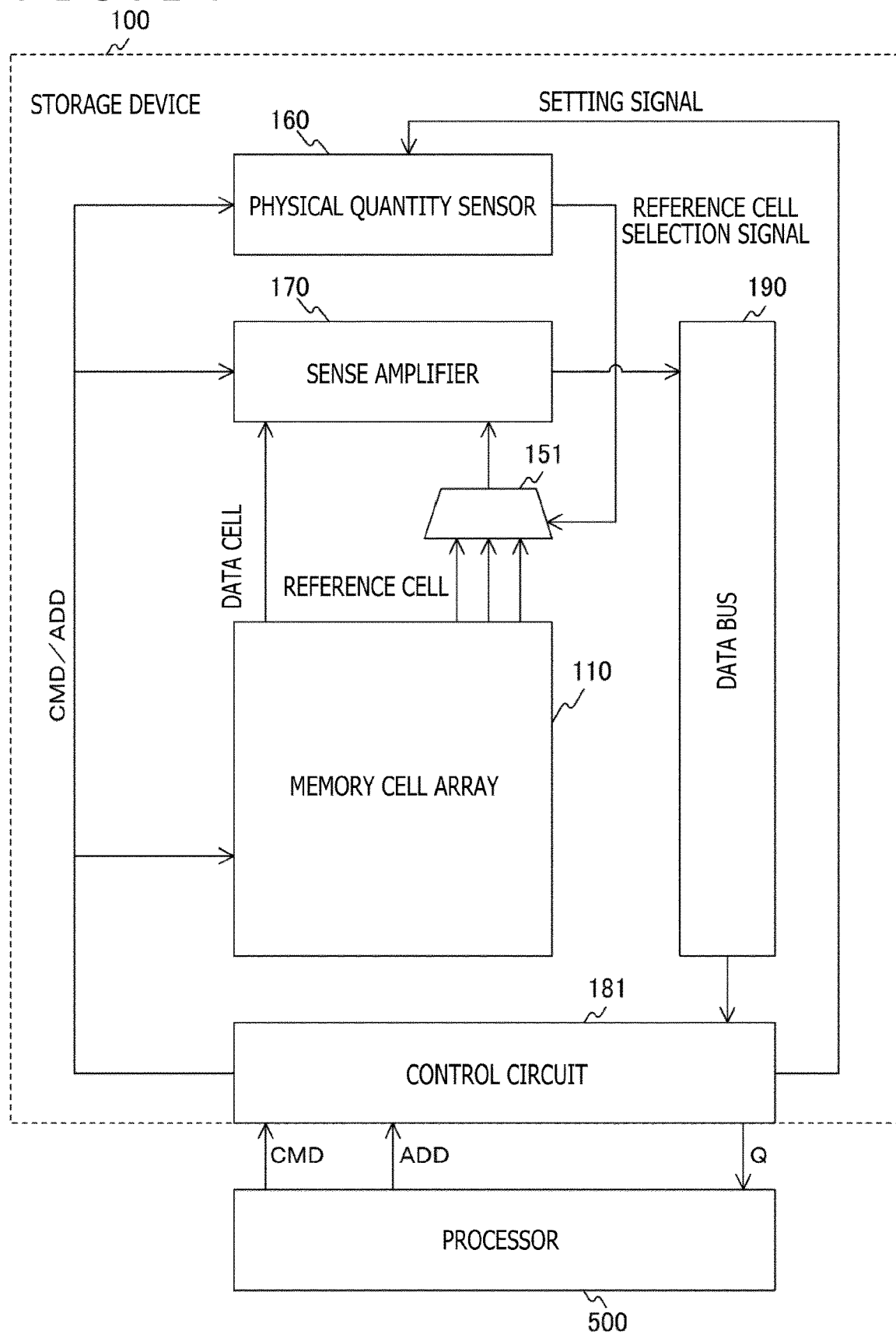
FIG. 14 is a diagram illustrating an overall configuration example of the storage device 100 according to a modification example of the first embodiment of the present technology.

FIG. 14 is a diagram illustrating an overall configuration example of the storage device 100 in the modification example of the first embodiment of the present technology.

In this modification, the command signal is monitored by the control circuit 181 and, in the case where the read command is issued, the selection signal of the reference cell from the physical quantity sensor 160 is controlled so as not to be changed until the reading is completed. As a result, a problem caused by the variation of instruction for the reference cell used during reading can be prevented.

Figure 15:
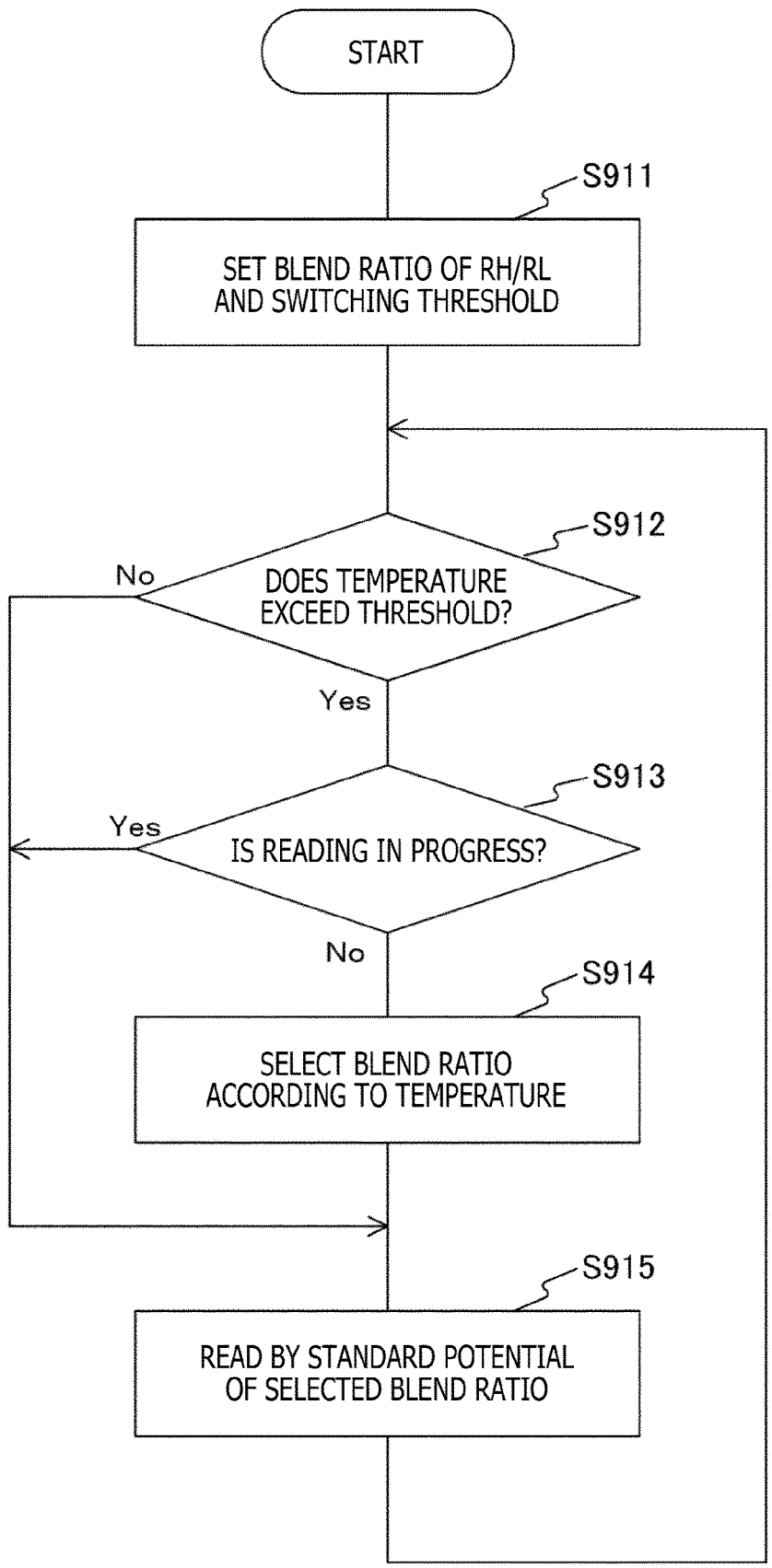
FIG. 15 is a flow chart illustrating an example of the processing procedure in the case of determining the ratio of reference cells according to the temperature in the modification example of the first embodiment of the present technology.

FIG. 15 is a flow chart illustrating an example of a processing procedure in the case of determining the ratio of reference cells according to the temperature in the modification example of the first embodiment of the present technology.

The optimum RH/RL blend ratio (ratio of reference cells) for a certain temperature is identified and set in advance in the reference cell (step S911). Further, a threshold value for switching the cell group to be used is set in the physical quantity sensor 160 (step S911).

In the case where the temperature exceeds the threshold value in the physical quantity sensor 160 (step S912: Yes), when reading is not in progress (step S913: No), the blend ratio according to the temperature is selected (step S914). When reading is in progress (step S913: Yes), the blend ratio is not changed. Then, reading is performed by using the standard potential of the selected blend ratio (step S915).

It is to be noted that although an example in the case of determining the ratio of reference cells according to the temperature has been described here, similar processing can be generalized to all physical quantities.

As described above, according to the first embodiment of the present technology, the standard potential in the sense amplifier 170 can be set by the ratio of the reference cells according to the physical quantity measured by the physical quantity sensor 160.

That is, in the resistance-change-type memory, the yield can be improved and the operation speed can be increased by maximizing the read margin even at a high temperature in which the read margin generally decreases. In addition, local optimization of read margins within memory macros, which has been difficult in the past, can also become possible.

2. Second Embodiment

[Storage Device]

Figure 16:
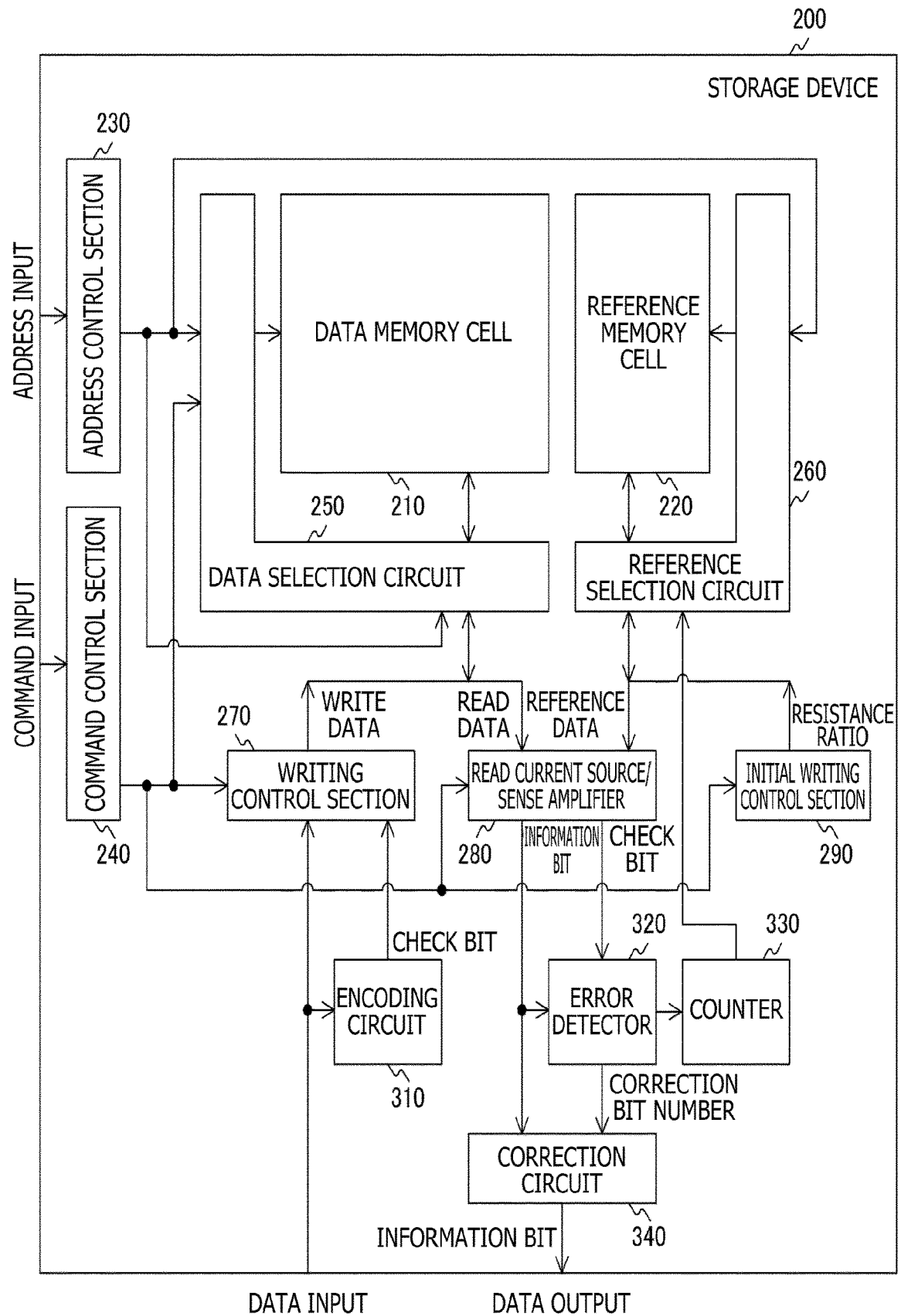
FIG. 16 is a diagram illustrating an overall configuration example of a storage device 200 according to a second embodiment of the present technology.

FIG. 16 is a diagram illustrating an overall configuration example of a storage device 200 according to the second embodiment of the present technology.

The storage device 200 includes a data memory cell 210, a reference memory cell 220, an address control section 230, a command control section 240, a data selection circuit 250, a reference selection circuit 260, a writing control section 270, and a read current source/sense amplifier 280, an initial writing control section 290, an encoding circuit 310, an error detector 320, a counter 330, and a correction circuit 340.

The data memory cell 210 is a two-dimensional matrix array of memory cells that stores data. The reference memory cell 220 is a two-dimensional matrix array of memory cells that store reference potentials. The data memory cell 210 and the reference memory cell 220 each have a similar configuration to the memory cell array 110 in the first embodiment described above. Note that the data memory cell 210 is an example of the data memory cell group described in the claims. Further, the reference memory cell 220 is an example of the reference memory cell group described in the claims.

The address control section 230 receives an address input from the host computer 500 and controls a memory cell accessed in the data memory cell 210 according to the address.

The command control section 240 receives a command input from the host computer 500 and controls the data memory cell 210 according to the command to cause the data memory cell 210 to write or read.

The data selection circuit 250 selects word lines, bit lines, and source lines in the data memory cell 210. The reference selection circuit 260 selects word lines, bit lines, and source lines in the reference memory cell 220. Incidentally, the reference selection circuit 260 is an example of the standard potential generating section described in the claims.

The writing control section 270 controls writing to the data memory cell 210.

The read current source/sense amplifier 280 is a current source and sense amplifier for reading from the data memory cell 210.

The initial writing control section 290 controls the reference memory cell 220 for the writing of the initial writing so that the reference memory cell 220 has a predetermined ratio of the resistance state in advance. The initial writing timing may be time of factory shipment, power-on timing, or periodic timing, for example.

The encoding circuit 310 generates inspection codes of error correction codes for the write data input from the host computer 500. Hereinafter, the write data before encoding is referred to as an information bit, and the generated inspection code is referred to as a check bit.

The error detector 320 is a circuit that detects a bit error with respect to the information bit and the check bit read from the data memory cell 210. In the case where a bit error is detected, the error detector 320 outputs a correction bit number indicating the number of bit of the read data (information bit and check bit) in which the error is detected. Incidentally, the error detector 320 is an example of the error detecting section and the reference potential selection control section described in the claims.

The counter 330 is a counter that switches the combination having a ratio of RL to RH of the reference potential. The counter 330 sequentially counts until no error is detected by the error detector 320. As a result, the combination having a ratio of RL to RH of the reference potential is sequentially changed.

The correction circuit 340 corrects the read data (information bit and check bit) according to the correction bit number output from the error detector 320, and outputs the data corresponding to the information bit.

Figure 17:
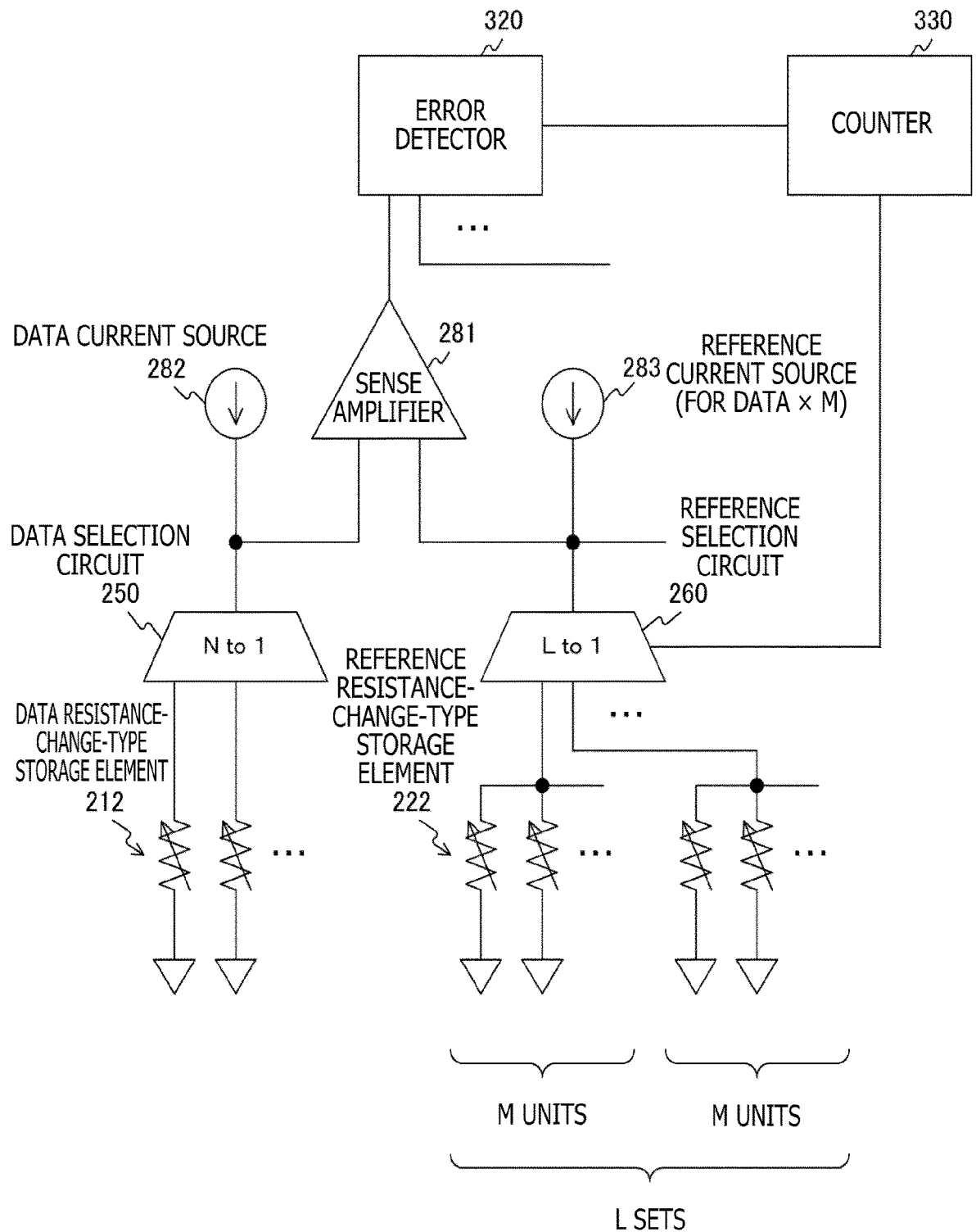
FIG. 17 is a diagram illustrating main parts of a configuration example of the storage device 200 according to the second embodiment of the present technology.

FIG. 17 is a diagram illustrating main parts of a configuration example of the storage device 200 according to the second embodiment of the present technology.

The storage device 200 includes a sense amplifier 281, a data current source 282, and a reference current source 283 as the above-mentioned read current source/sense amplifier 280.

The data selection circuit 250 selects one element from N data resistance-change-type storage elements 212 of the data memory cell 210, and causes the current from the data current source 282 to flow through the element. The potential generated by this is input to one input terminal of the sense amplifier 281.

The reference selection circuit 260 selects one set from L sets of reference resistance-change-type storage elements 222 of the reference memory cell 220, and causes the current from the reference current source 283 to flow through the set. Since M reference resistance-change-type storage elements 222 are connected in each set, the potentials generated by these are short-circuited on the signal line. The generated potential is input to the other input terminal of the sense amplifier 281.

For example, M reference memory cells 220 referenced at the same time desirably form a combination of four low resistances and four high resistances, in the case of M=8. As the value of M becomes larger, the amount of change per step becomes smaller, and fine adjustment becomes possible. In the case where the MR ratio (Magneto Resistance ratio) of the memory cell is small, there is a risk that normal reading cannot be executed if elements that vary by approximately 5σ appear.

Therefore, as illustrated below, a combination having a ratio of low resistance to high resistance such as 5:3 or 3:5 is prepared in advance, and the reference selection circuit 260 is switched to attempt recovery when the error detector 320 detects an error, and the read margin is enlarged without interrupting the reading operation.

[Ratio of Reference Cells]

FIG. 18 is a diagram illustrating an example of options for the ratio of reference cells in the second embodiment of the present technology.

Option A illustrates a combination of four low resistance and four high resistance in the case of M=8. Option B illustrates a combination whose ratio of low resistance to high resistance is 5:3. Option C illustrates a combination whose ratio of low resistance to high resistance is 3:5. When the error detector 320 detects an error, the counter 330 sequentially counts from "1," and the reference selection circuit 260 changes the ratio of low resistance to high resistance of the reference cell accordingly. As a result, when the error detector 320 begins to detect no error, the data read at that time is treated as correct data, and the reading operation is terminated.

Here, the defective bit to be relieved from the error is a cell having a resistance of RL deviated high (σ is a positive direction) or a cell having a resistance of RH deviated low (σ is a negative direction). The probability that a cell having both properties for one cell appears will have twice the standard deviation and the case is extremely rare, so that relief from errors can be obtained by giving a bias to either side.

[Data Selection Circuit]

Figure 19:
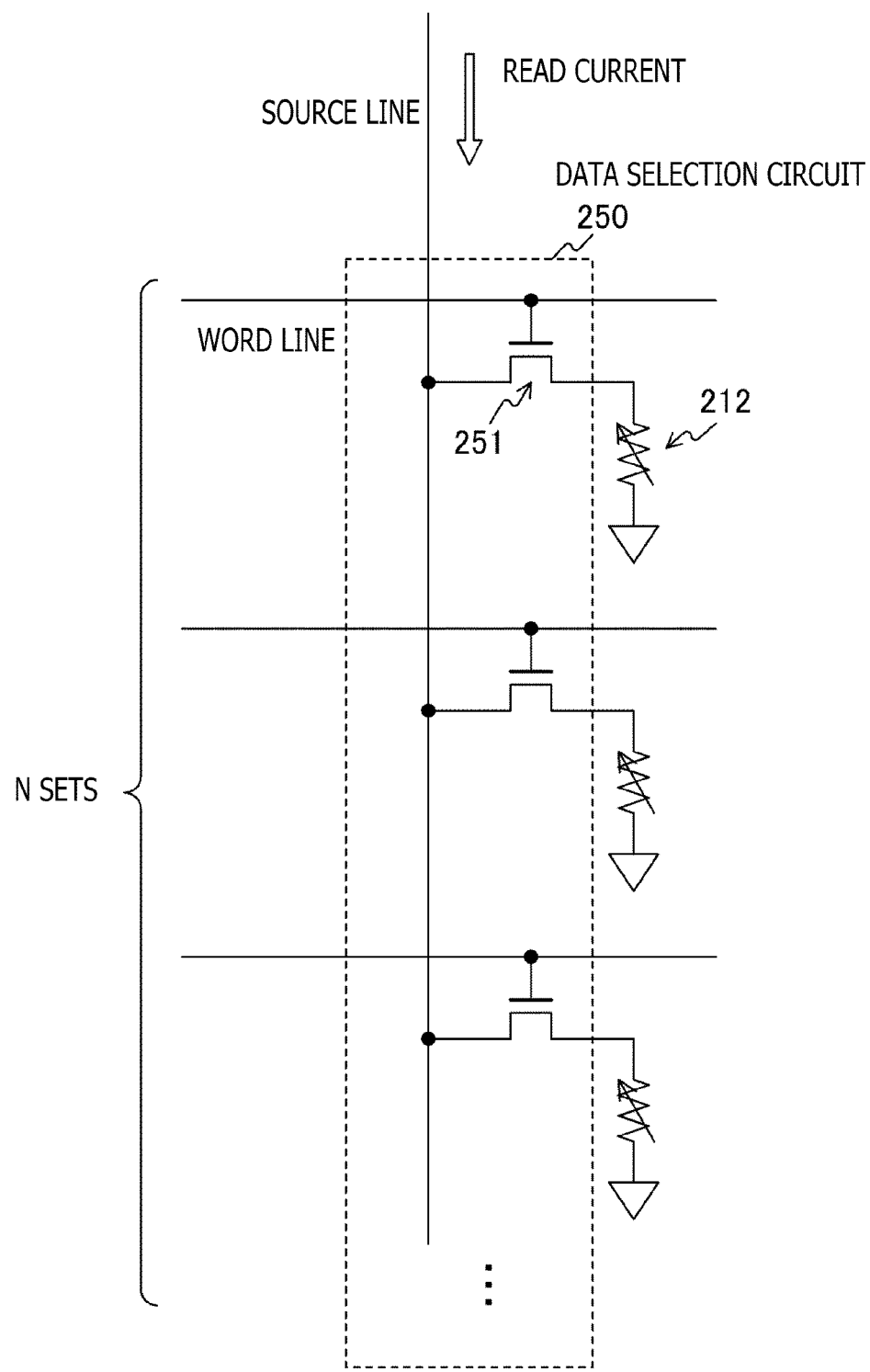
FIG. 19 is a diagram illustrating a first configuration example of a data selection circuit 250 according to the second embodiment of the present technology.

FIG. 19 is a diagram illustrating a first configuration example of the data selection circuit 250 according to the second embodiment of the present technology.

In this first configuration example, N selection transistors 251 for selecting memory cells are arranged in the column direction. At this time, the wiring for selecting the selection transistor is the word line, and the wiring to which the read current is applied is the source line.

Figure 20:
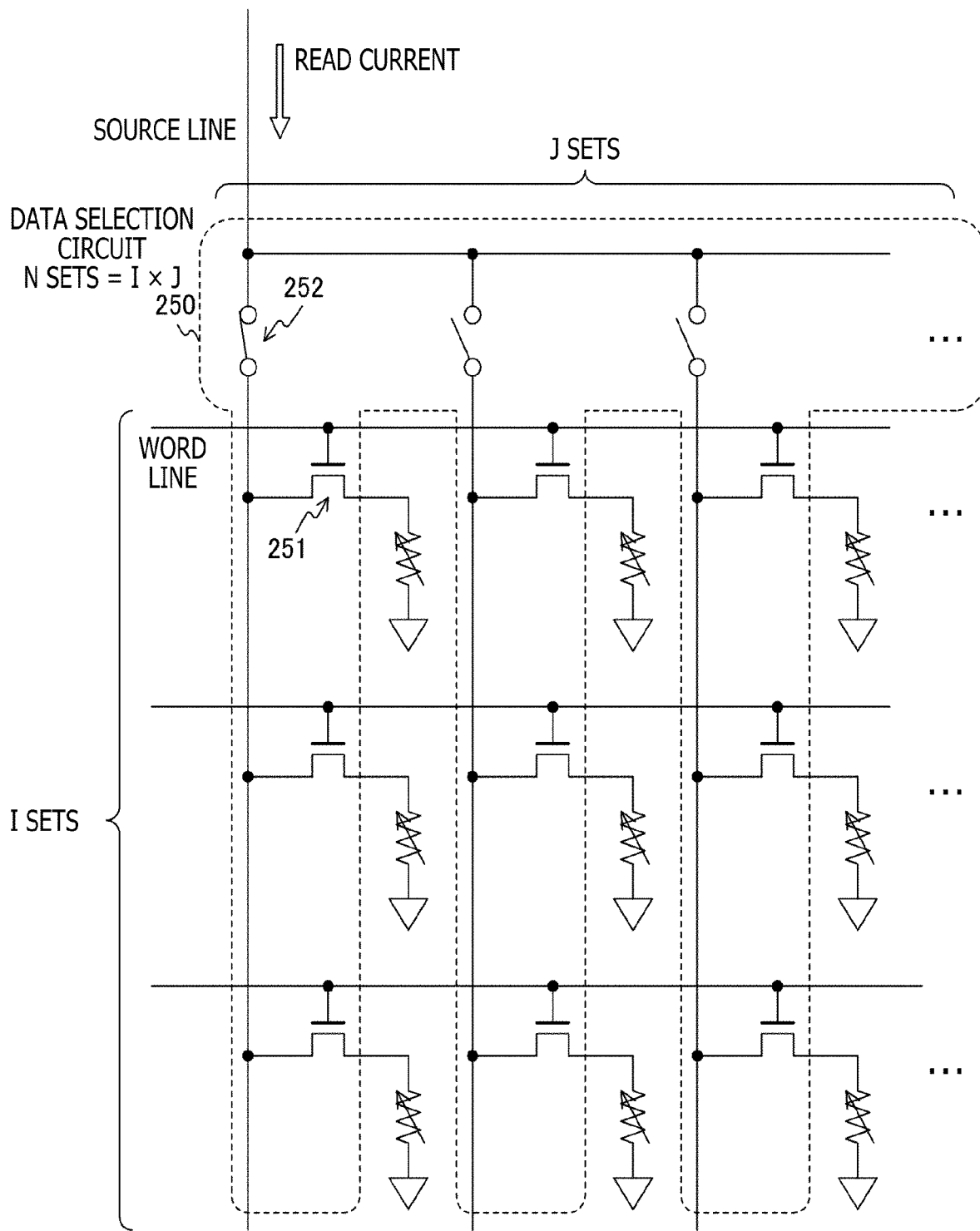
FIG. 20 is a diagram illustrating a second configuration example of the data selection circuit 250 according to the second embodiment of the present technology.

FIG. 20 is a diagram illustrating a second configuration example of the data selection circuit 250 according to the second embodiment of the present technology.

In this second configuration example, the selection mechanism is arranged in two steps by arranging units of the first configuration example in the row direction. When one of the I sets of word lines is selected, J selection transistors 251 are electrically connected, and by selecting one of the J source lines by a switch 252, the read current is applied to the target memory cell. At this time, N=I×J is satisfied.

[Reference Selection Circuit]

Figure 21:
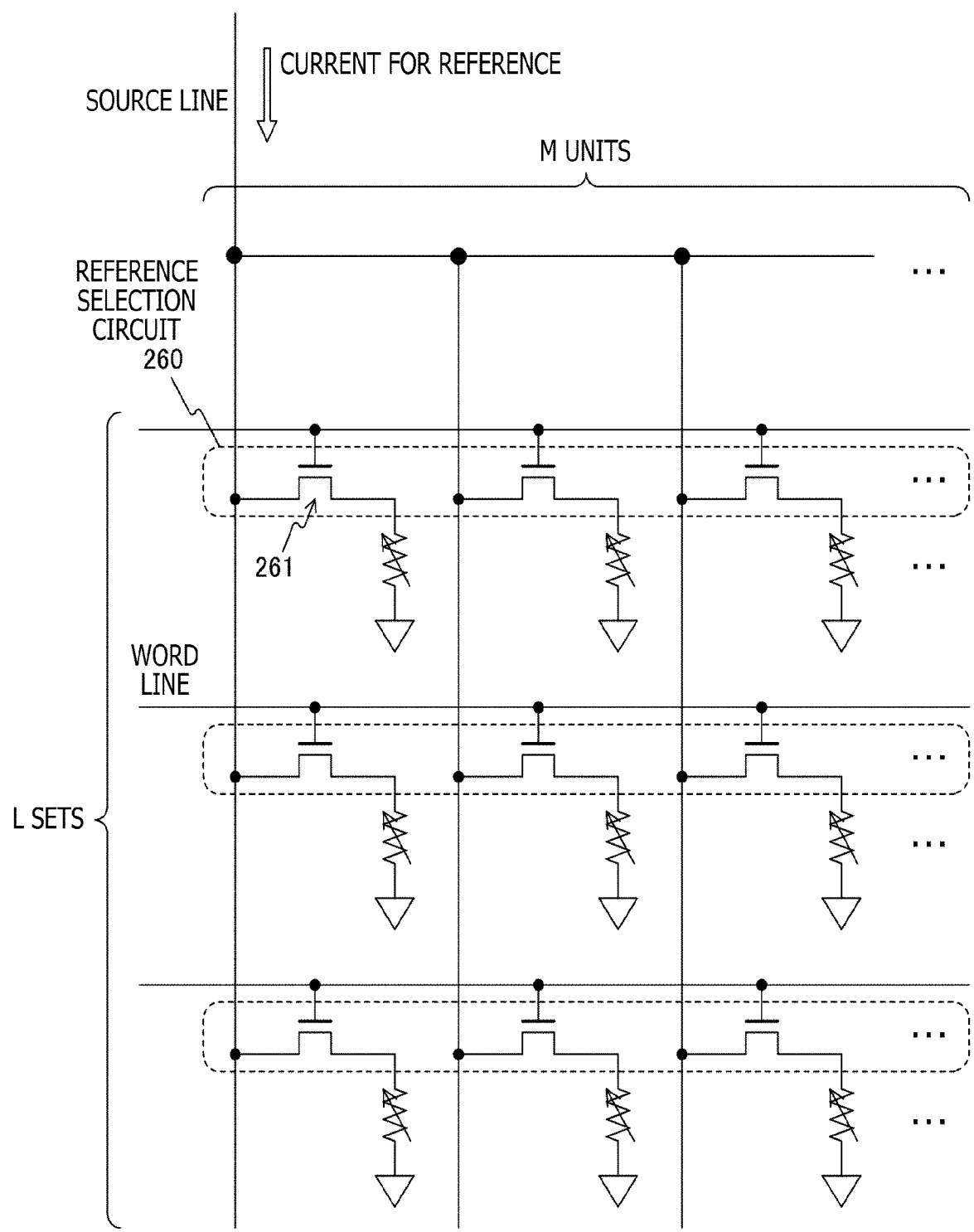
FIG. 21 is a diagram illustrating a first configuration example of a reference selection circuit 260 according to the second embodiment of the present technology.

FIG. 21 is a diagram illustrating a first configuration example of the reference selection circuit 260 in the second embodiment of the present technology.

In this first configuration example, L selection transistors 261 for selecting memory cells are arranged in a column direction along a source line. The source line branches into M lines, which are lined up in the row direction. When one word line is selected, reading is carried out from M memory cells, which are short-circuited on the source line.

Figure 22:
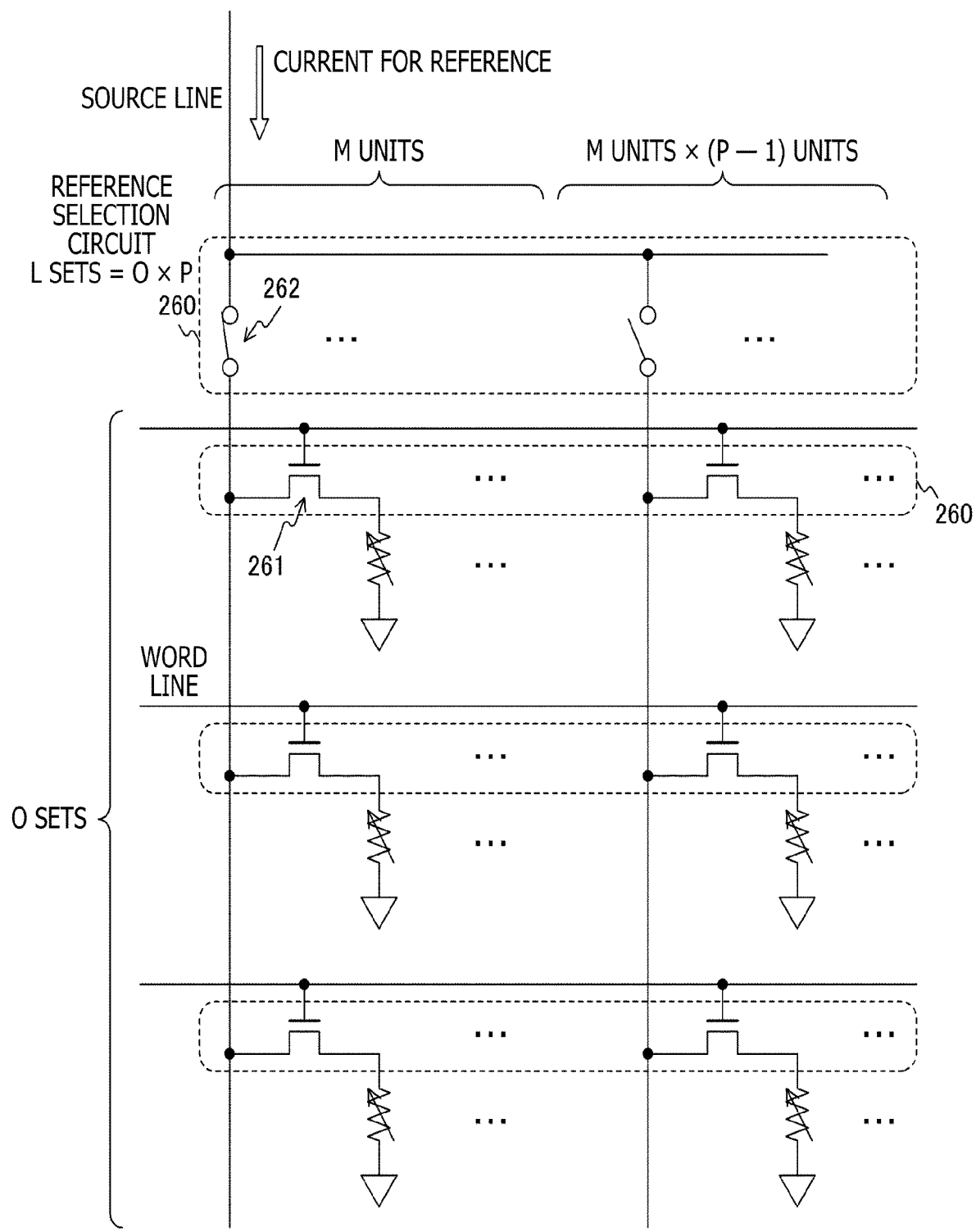
FIG. 22 is a diagram illustrating a second configuration example of the reference selection circuit 260 according to the second embodiment of the present technology.

FIG. 22 is a diagram illustrating a second configuration example of the reference selection circuit 260 according to the second embodiment of the present technology.

This second configuration example has a configuration in which P units of the first configuration example are arranged in the row direction, and is an example of selecting in two steps of word line selection and source line selection. When one of P switches 262 is selected and one of O selection transistors 261 is selected, readings are made from M memory cells, and then short-circuited on the source line. The combination in this case satisfies L=O×P.

Figure 23:
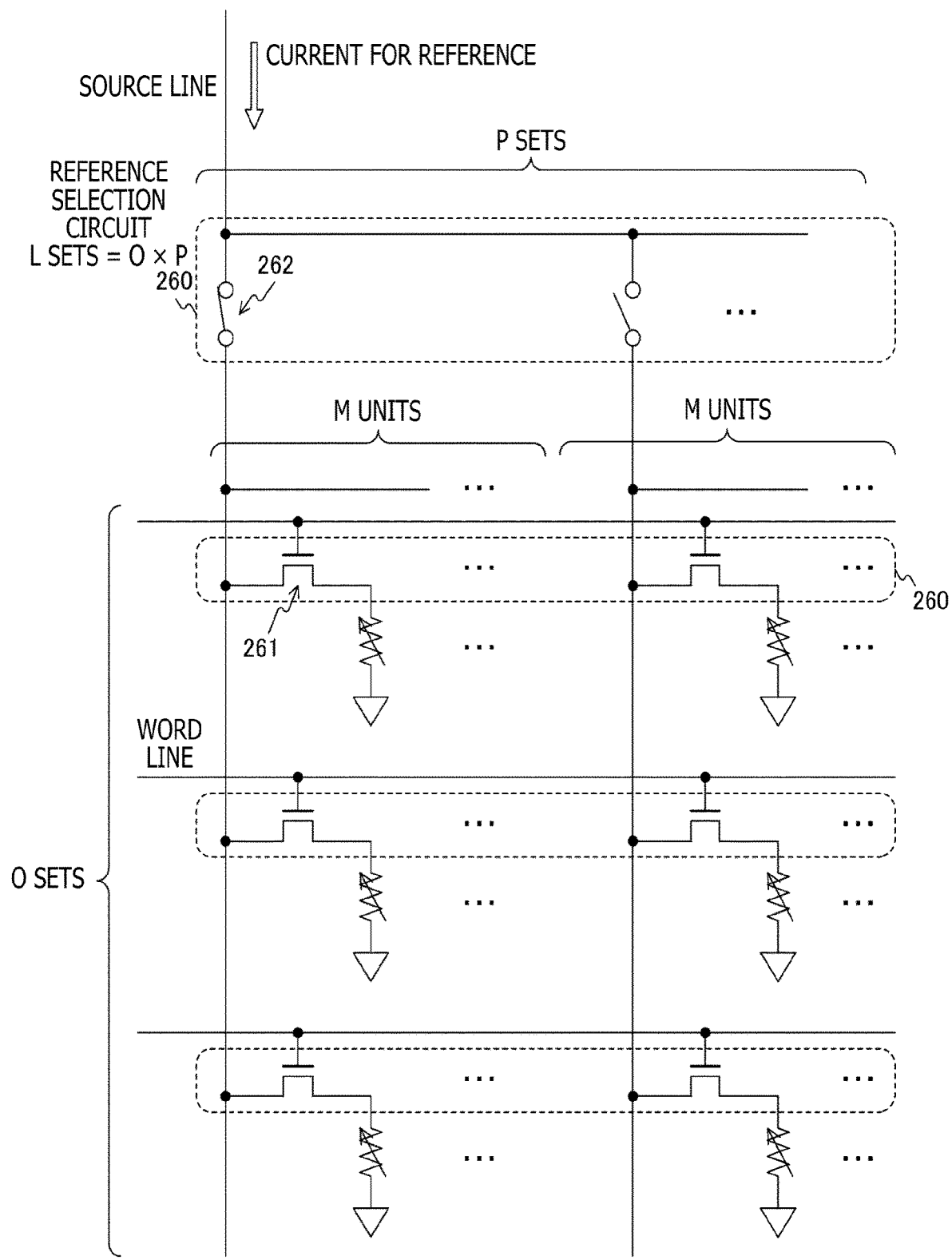
FIG. 23 is a diagram illustrating a third configuration example of the reference selection circuit 260 according to the second embodiment of the present technology.

FIG. 23 is a diagram illustrating a third configuration example of the reference selection circuit 260 according to the second embodiment of the present technology.

This third configuration example is an example in which the positions where M source lines are short-circuited are different from those of the second configuration example, and the source lines are short-circuited before the selection of the source lines.

[Operation]

Figure 24:
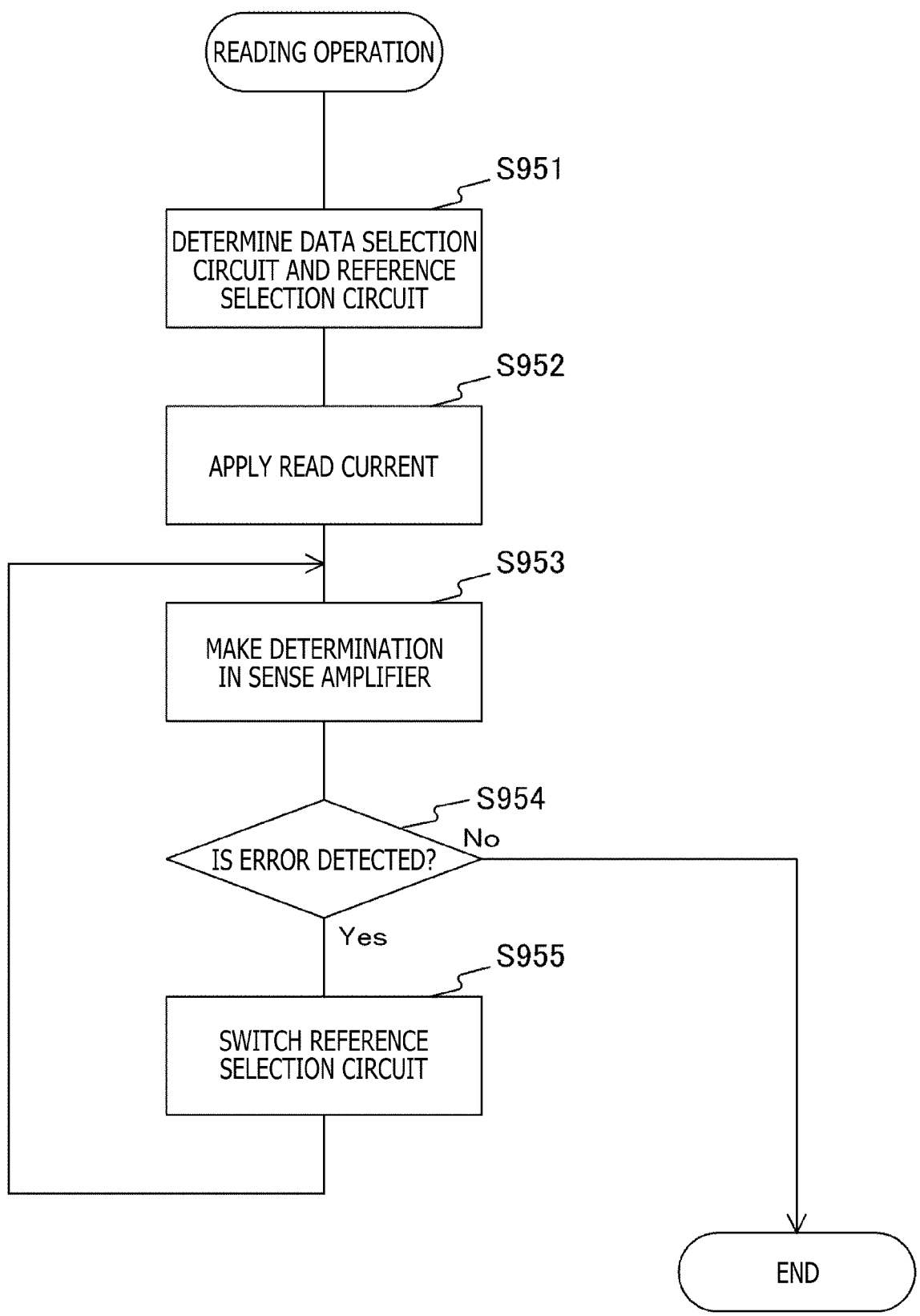
FIG. 24 is a flow chart illustrating an example of the processing procedure in the case of changing the ratio of the reference cells according to an error detection state according to the second embodiment of the present technology.

FIG. 24 is a flow chart illustrating an example of a processing procedure in the case where the ratio of reference cells is changed according to an error detection state in the second embodiment of the present technology.

First, the selection state in the data selection circuit 250 and the reference selection circuit 260 is determined (step S951). That is, in the data selection circuit 250, the data to be read from the data memory cell 210 is determined. Further, the ratio of the low resistance to the high resistance in the reference selection circuit 260 is set to the initial state. Then, a read current is applied from the data current source 282 and the reference current source 283 (step S952).

Reading is performed in the sense amplifier 281 with the potential supplied from the reference selection circuit 260 as a standard potential (step S953), and as a result, error detection is determined in the error detector 320. When an error is detected in the error detector 320 (step S954: Yes), the selection in the reference selection circuit 260 is switched according to the counter 330 (step S955). Then, reading is performed again in the sense amplifier 281 with the potential supplied from the reference selection circuit 260 after the switching as the standard potential (step S953). The counter 330 is sequentially counted, and these processes are repeated until no error is detected in the error detector 320.

In the related art, since the current continues to flow to the reference memory cell during the reading in the resistance-change-type memory, the writing current for changing the reference level cannot be applied to the reference memory cell, and thus it is necessary to stop the reading operation once. On the other hand, in this embodiment, since the reference memory cell 220 in which writing is executed in advance so that the reference level is different is provided, the reference level can be switched without interrupting the supply of the current source for reading.

Modification Example

Figure 25:
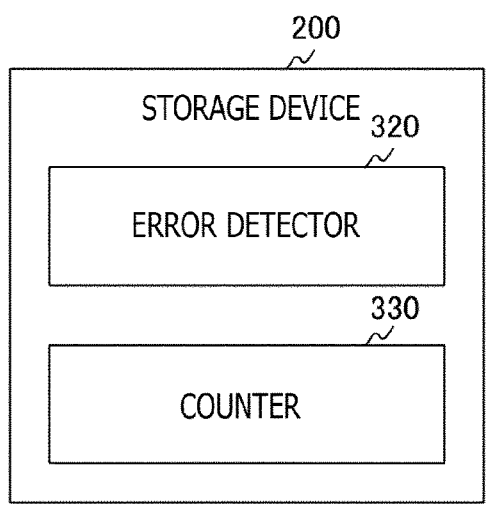
FIG. 25 is a diagram illustrating an arrangement example of an error detector 320 and a counter 330 according to the second embodiment of the present technology.
Figure 25:
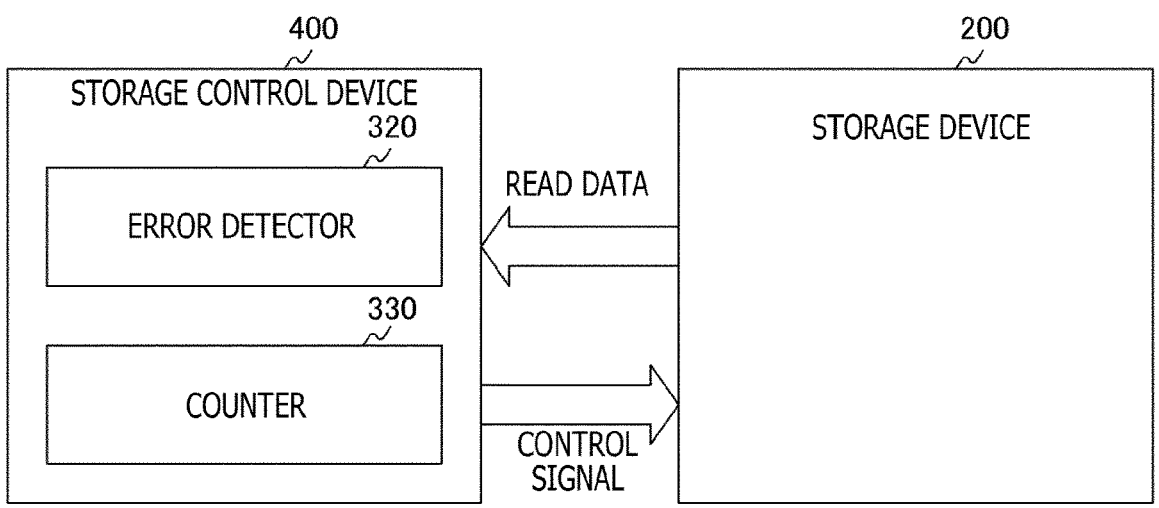
Figure 25:
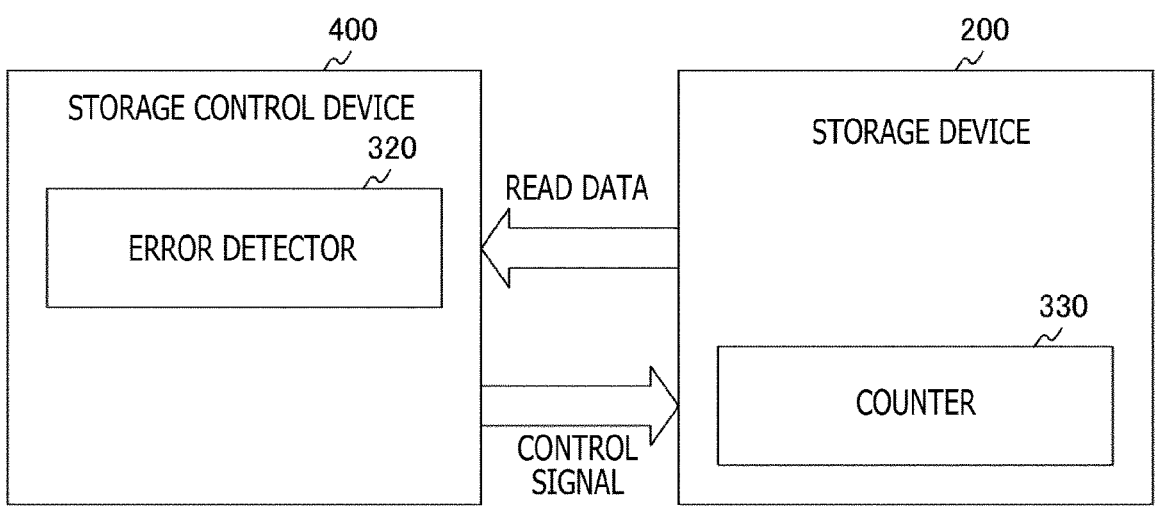

FIG. 25 is a diagram illustrating an arrangement example of the error detector 320 and the counter 330 in the second embodiment of the present technology.

As illustrated in a of the figure, the storage device 200 in the second embodiment described above incorporates the error detector 320 and the counter 330 inside. However, as illustrated in b of the figure, the error detector 320 and the counter 330 may be arranged in a storage control device 400 outside the storage device 200. Further, as illustrated in c of the figure, a part may be arranged in the storage device 200 and the other part may be arranged in the storage control device 400.

As described above, according to the second embodiment of the present technology, the standard potential in the sense amplifier 281 can be set by the ratio of the reference cells according to the error detection state in the error detector 320. This makes it possible to switch the reference level without interrupting the supply of the current source for reading.

That is, highly reliable memory reading can be easily maintained while suppressing performance degradation and the area of the circuit. Further, since the method leads to suppression of unnecessary writing operations to the reference memory cell 220 and suppression of rewrite operations into defective bits, the life of the memory circuit using a memory cell having an upper limit on the number of writing operations and a system on which the circuit is mounted can be lengthened.

3. Application Example

Figure 26:
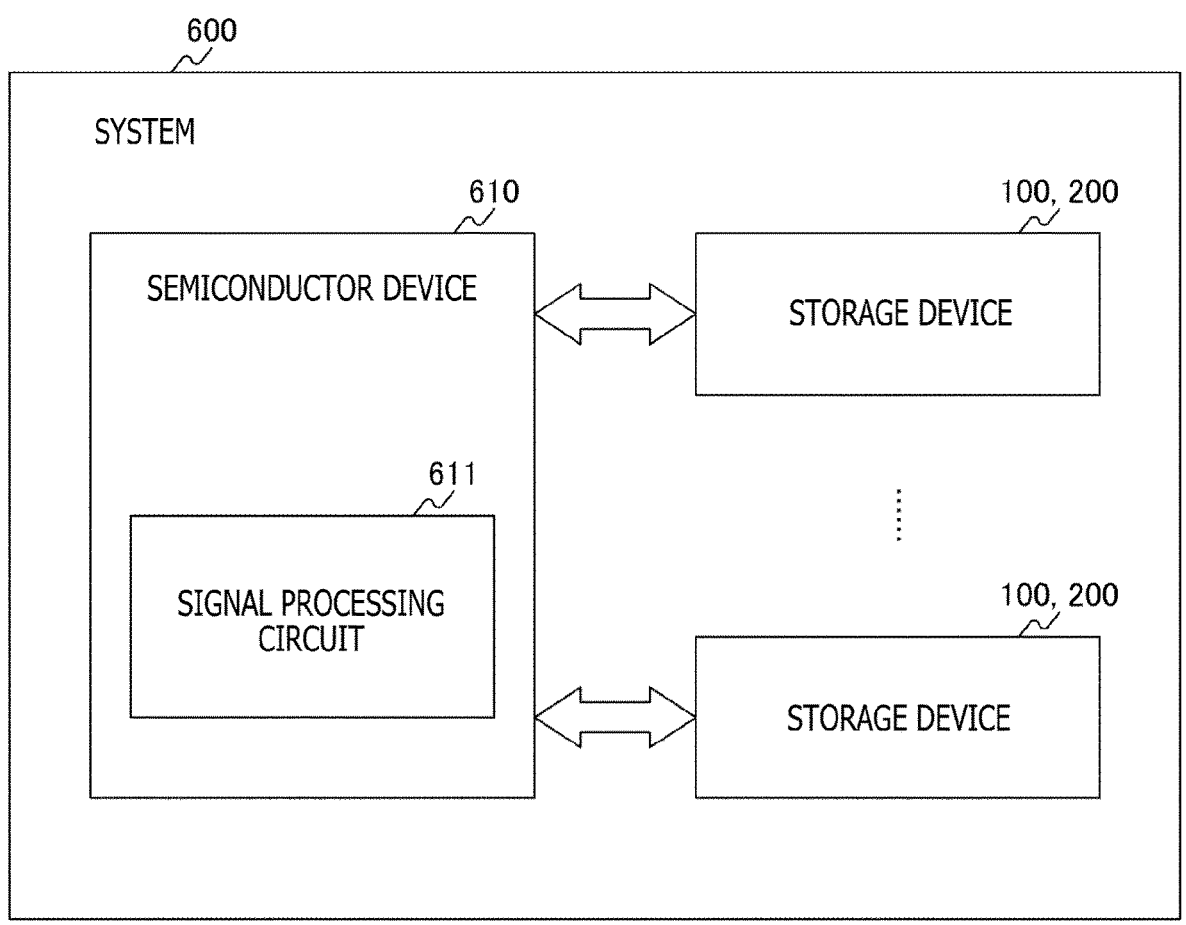
FIG. 26 is a diagram illustrating an application example of the storage devices 100 and 200 according to the embodiment of the present technology.
Figure 27:
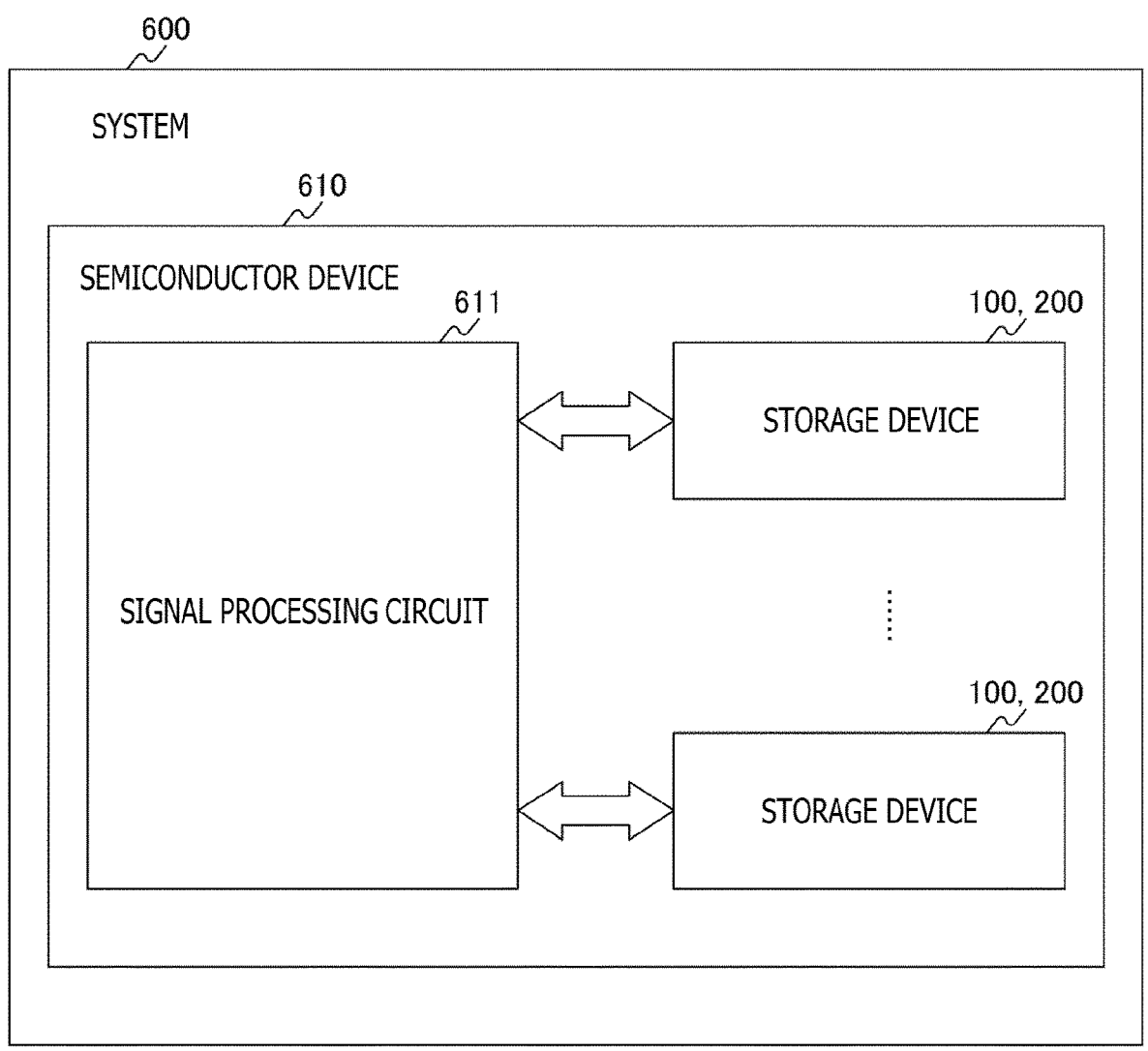
FIG. 27 is a diagram illustrating another application example of the storage devices 100 and 200 according to the embodiment of the present technology.

FIGS. 26 and 27 are diagrams illustrating application examples of the storage device 100 or 200 in the embodiment of the present technology.

One or more of the storage device 100 or 200 according to the embodiment of the present disclosure may be incorporated in the same semiconductor device as the control circuit that controls the storage device 100 or 200, or may be incorporated in a semiconductor device different from the control circuit.

The example of FIG. 26 is an example of a system 600 in which the storage device 100 or 200 is connected to a semiconductor device 610 including a signal processing circuit 611. The signal processing circuit 611 is a circuit that generates a signal for reading and writing data with respect to the storage device 100 or 200.

The example of FIG. 27 is an example of the system 600 in which the storage device 100 or 200 is provided inside the semiconductor device 610 including the signal processing circuit 611.

Figure 28:
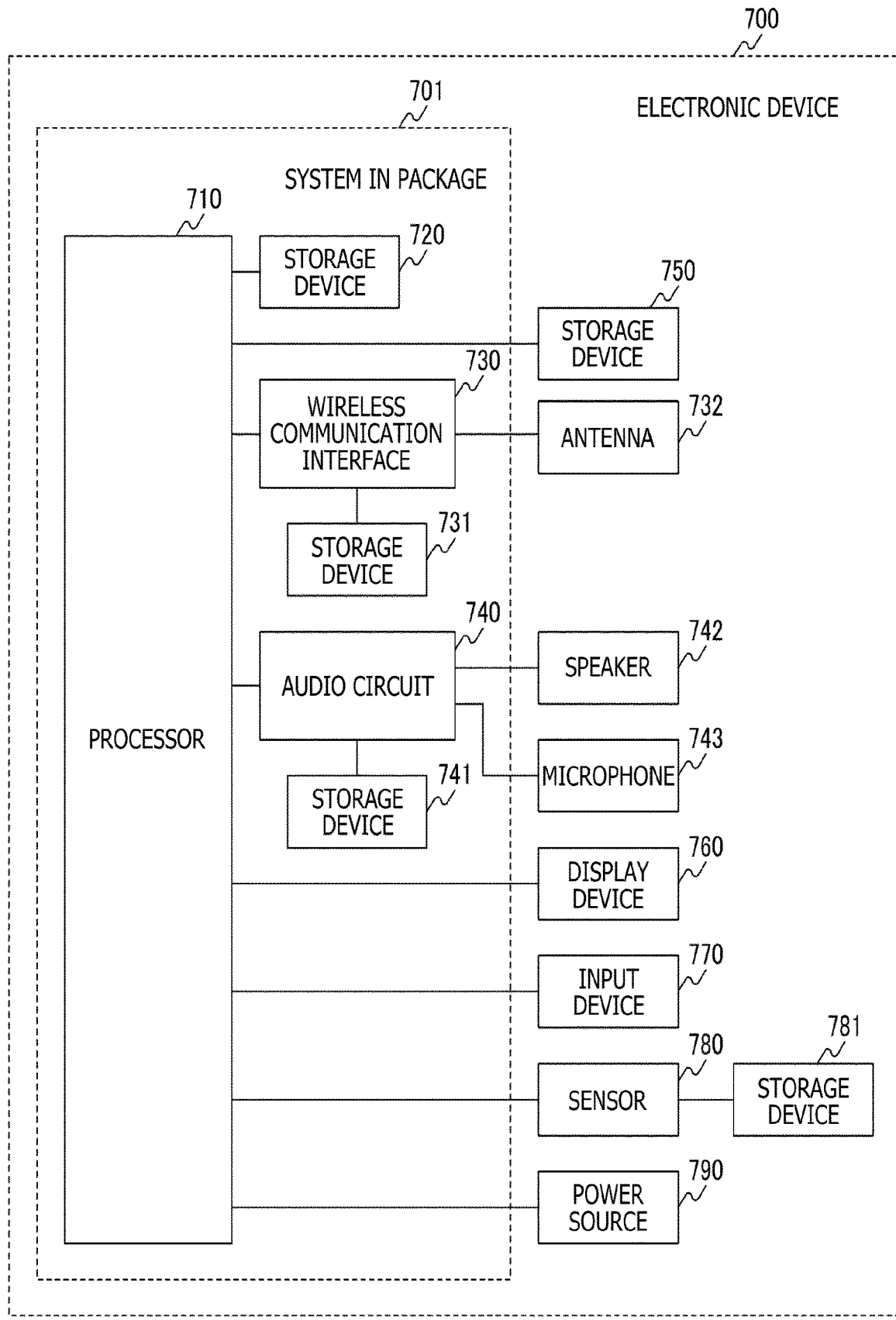
FIG. 28 is a diagram illustrating a configuration example of an electronic device 700 to which the storage devices 100 and 200 according to the embodiment of the present technology are applied.

FIG. 28 is a diagram illustrating a configuration example of an electronic device 700 to which the storage device 100 or 200 according to the embodiment of the present technology is applied.

As the electronic device 700, a smartphone, a digital camera, a digital video camera, a music player, a set top box, a computer, a television, a clock, an active speaker, a headset, a game machine, a radio, a measuring instrument, an electronic tag, a beacon, etc. are assumed. The electronic device 700 includes a power source 790 and an interface such as an input device 770 and a display device 760, for example.

The storage device 100 may be connected as a storage device 720 or 750 connected to a processor 710 mounted on a system in package 701 (or system-on-chip).

A wireless communication interface 730 has functions of mobile communications, Wi-Fi (registered trademark), or short-range communication, and an antenna 732 and a resistance-change-type storage device 731 may be connected to the wireless communication interface 730.

An audio circuit 740 has a function of controlling a speaker 742 and a microphone 743, and a resistance-change-type storage device 741 may be connected to the audio circuit 740.

A sensor 780 has the functions of an optical sensor, a position sensor, an acceleration sensor, a biosensor, a magnetic sensor, a mechanical amount sensor, a thermal sensor, an electric sensor, or a chemical sensor, and a resistance-change-type storage device 781 may be connected to the sensor 780.

It should be noted that the above-described embodiments demonstrate examples for embodying the present technology, and the matters in the embodiments and the matters specifying the invention within the claims have a corresponding relation to each other. Similarly, the matters specifying the invention within the claims and the matters in the embodiments of the present technology having the same name have a corresponding relation to each other. However, the present technology is not limited to the embodiments, and can be embodied by applying various modifications to the embodiments without departing from the gist thereof.

Further, the processing procedure described in the above-described embodiments may be regarded as a method having these series of procedures, or as a program causing a computer to execute these series of procedures or as a recording medium for storing the program. As the recording medium, for example, a CD (Compact Disc), an MD (Mini-Disc), a DVD (Digital Versatile Disc), a memory card, a Blu-ray Disc (Blu-ray (registered trademark) Disc), and the like can be used.

It should be noted that the effects described in the present specification are merely examples and the invention is not limited thereto, and other effects may be obtained.

The present technology can also have the following configurations.

(1)

A storage device including:
   a data memory cell group for storing data;
   a reference memory cell group for storing a plurality of reference potentials;
   a standard potential generating section for generating a standard potential by selecting a predetermined number of reference potentials from the plurality of reference potentials stored in the reference memory cell group;
   a reference potential selection control section for controlling the selection in the standard potential generating section according to a predetermined condition; and
   a sense amplifier for amplifying the data read from the data memory cell group with the standard potential set as a standard.

(2)

The storage device according to (1), in which
   the reference memory cell group stores one of first and second potentials as the plurality of reference potentials, and
   the standard potential generating section selects the first and second potentials at a predetermined ratio as the predetermined number of reference potentials, and generates a potential between the first potential and the second potential as the standard potential.

(3)
The storage device according to (2), in which
the standard potential generating section generates the standard potential by causing short circuit between the first potential and the second potential that are selected at the predetermined ratio on a signal line.

(4)
The storage device according to any one of (1) to (3), in which
the reference potential selection control section includes a sensor for measuring a physical quantity of a surrounding environment and controls the selection in the standard potential generating section according to the condition of the physical quantity as the predetermined condition.

(5)
The storage device according to (4), in which
the sensor measures at least one of a temperature, a voltage, and a magnetic force as the physical quantity.

(6)
The storage device according to (4), in which
the reference potential selection control section controls the selection in the standard potential generating section according to the physical quantity condition that differs for each region in the storage device.

(7)
The storage device according to (4), further including:
a command control section that receives a command that gives an instruction to access the data memory cell group, in which
the reference potential selection control section has control to suppress the change of the standard potential when the execution of the command is in progress.

(8)
The storage device according to any one of (1) to (3), in which
the reference potential selection control section includes an error detecting section that detects an error in the data read from the data memory cell group and controls the selection in the standard potential generating section according to the error detection condition as the predetermined condition.

(9)
The storage device according to (8), in which
the reference memory cell group stores one of first and second potentials as the plurality of reference potentials, and
the standard potential generating section selects the first and second potentials at a predetermined ratio as the predetermined number of reference potentials, and generates a potential between the first potential and the second potential as the standard potential, and
the reference potential selection control section sequentially changes the ratio of the first and second potentials while the error is being detected.

(10)
The storage device according to (9), in which
the reference potential selection control section further includes a counter that switches the combination having a ratio between the first and second potentials, and causes the counter to perform switching so as to change the ratio between the first and second potentials until no error is detected.

(11)
The storage device described in any one of items (1) to (10), in which
the reference memory cell group includes a resistance-change-type memory cell as a storage element.

REFERENCE SIGNS LIST

100: Storage device
110: Memory cell array
111: Memory cell
112: Resistance-change-type element
113: Switch
120: Row decoder
130: Word line driver
140: Write-read power supply circuit
150: Column selection circuit
151: Selection circuit
157: Sense selection circuit
160: Physical quantity sensor
170: Sense amplifier
180: Address decoder
181: Control circuit
190: Data bus
200: Storage device
210: Data memory cell
212: Data resistance-change-type storage element
220: Reference memory cell
222: Reference resistance-change-type storage element
230: Address control section
240: Command control section
250: Data selection circuit
251: Selection transistor
252: Switch
260: Reference selection circuit
261: Selection transistor
262: Switch
270: Writing control section
280: Read current source/sense amplifier
281: Sense amplifier
282: Data current source
283: Reference current source
290: Initial writing control section
310: Encoding circuit
320: Error detector
330: Counter
340: Correction circuit
400: Storage control device
500: Host computer

The invention claimed is:
1. A storage device comprising:
a data memory cell group that stores data;
a reference memory cell group that stores a plurality of reference potentials;
a standard potential generating section that generates a standard potential by selecting a predetermined number of reference potentials from the plurality of reference potentials stored in the reference memory cell group;
a reference potential selection control section that controls selection in the standard potential generating section according to a predetermined condition; and
a sense amplifier that amplifies the data read from the data memory cell group with the standard potential set as a standard, wherein
the reference potential selection control section includes an error detecting section that detects an error in data read from the data memory cell group and controls the selection in the standard potential generating section according to a condition of the detection of the error as the predetermined condition, the reference memory cell group stores one of first and second potentials as the plurality of reference potentials, the standard potential generating section selects the first and second potentials at a predetermined ratio as the predetermined number of reference potentials, and generates a potential between the first potential and the second potential as the standard potential, the reference potential selection control section sequentially changes the ratio of the first and second potentials while the error is being detected, and the reference potential selection control section further includes a counter that switches a combination having a ratio between the first and second potentials, and causes the counter to perform switching so as to change the ratio between the first and second potentials until no error is detected.

2. The storage device according to claim 1, wherein the standard potential generating section generates the standard potential by causing short circuit between the first potential and the second potential that are selected at the predetermined ratio on a signal line.

3. The storage device according to claim 1, wherein the reference potential selection control section includes a sensor for measuring a physical quantity of a surrounding environment and controls the selection in the standard potential generating section according to a condition of the physical quantity as the predetermined condition.

4. The storage device according to claim 3, wherein the sensor measures at least one of a temperature, a voltage, and a magnetic force as the physical quantity.

5. The storage device according to claim 3, wherein the reference potential selection control section controls the selection in the standard potential generating section according to the condition of the physical quantity that differs for each region in the storage device.

6. The storage device according to claim 3, further comprising:
a command control section that receives a command that gives an instruction to access the data memory cell group, wherein
the reference potential selection control section has control to suppress a change of the standard potential when execution of the command is in progress.

7. The storage device according to claim 1, wherein the reference memory cell group includes a resistance-change-type memory cell as a storage element.

* * * * *